(12) United States Patent
Tokunaga

(10) Patent No.: US 7,985,527 B2
(45) Date of Patent: Jul. 26, 2011

(54) CONDUCTIVE FILM AND METHOD OF PRODUCING THEREOF

(75) Inventor: Tsukasa Tokunaga, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/441,470

(22) PCT Filed: Dec. 21, 2007

(86) PCT No.: PCT/JP2007/074741
§ 371 (c)(1),
(2), (4) Date: Mar. 16, 2009

(87) PCT Pub. No.: WO2008/075771
PCT Pub. Date: Jun. 26, 2008

(65) Prior Publication Data
US 2009/0272560 A1 Nov. 5, 2009

(30) Foreign Application Priority Data

Dec. 21, 2006 (JP) .................................. 2006-345000
Mar. 30, 2007 (JP) .................................. 2007-093021

(51) Int. Cl.
*G03F 7/00* (2006.01)
*G03F 7/06* (2006.01)
*G03F 7/26* (2006.01)

(52) U.S. Cl. ..................... 430/270.1; 430/348; 430/477; 430/566; 430/567; 430/627

(58) Field of Classification Search ............... 430/270.1, 430/567, 627, 566, 477, 348
See application file for complete search history.

(56) References Cited

U.S. PATENT DOCUMENTS

| | | | |
|---|---|---|---|
| 3,816,133 A * | 6/1974 | Weyde et al. | 430/21 |
| 3,909,262 A * | 9/1975 | Goffe et al. | 430/14 |
| 4,047,958 A * | 9/1977 | Yoneyama et al. | 430/527 |
| 6,734,120 B1 * | 5/2004 | Berry et al. | 438/715 |
| 7,695,640 B2 * | 4/2010 | Chichak et al. | 252/301.35 |
| 2007/0015094 A1 * | 1/2007 | Habu | 430/348 |
| 2007/0269675 A1 * | 11/2007 | Ichiki et al. | 428/603 |
| 2008/0251767 A1 * | 10/2008 | Winscom et al. | 252/500 |
| 2009/0233237 A1 * | 9/2009 | Yoshiki et al. | 430/311 |
| 2009/0241334 A1 * | 10/2009 | Inoue et al. | 29/846 |
| 2009/0295285 A1 * | 12/2009 | Tokunaga et al. | 313/505 |

FOREIGN PATENT DOCUMENTS

| | | |
|---|---|---|
| CN | 1159063 | 9/1997 |
| EP | 1032026 A2 * | 8/2000 |
| EP | 1434248 A2 * | 6/2004 |

(Continued)

OTHER PUBLICATIONS

Chinese Office Action dated Feb. 24, 2011 in corresponding Chinese Application No. 200780033715.5 with English translation of Chinese Office Action.

*Primary Examiner* — Amanda C. Walke
(74) *Attorney, Agent, or Firm* — Young & Thompson

(57) ABSTRACT

A method for producing a conductive film, having the steps: forming, on a support, a conductive metal portion containing a conductive material and a binder; bringing the conductive metal portion into contact with vapor or a hot water; and immersing the conductive metal portion into hot water having a temperature of 40° C. or higher.

16 Claims, 2 Drawing Sheets

(a) after developing (b) after calendering treatment (c) after water vapor treatment

FOREIGN PATENT DOCUMENTS

| | | |
|---|---|---|
| GB | 2308080 | 6/1997 |
| JP | 42-23746 | 11/1942 |
| JP | 10-41682 | 2/1998 |
| JP | 10-340629 | 12/1998 |
| JP | 2000-13088 | 1/2000 |
| JP | 2003-151362 | 5/2003 |
| JP | 2003-281947 | 10/2003 |
| JP | 2004-207001 | 7/2004 |

* cited by examiner

CONDUCTIVE FILM AND METHOD OF PRODUCING THEREOF

TECHNICAL FIELD

The present invention relates to a method for producing a conductive film having an improved conductivity, in particular, a translucent conductive film. More specifically, the present invention relates to a method for producing a conductive film by forming, on a support, a conductive metal portion containing a conductive material and a binder, and then treating the resultant metal portion with hot water or vapor.

BACKGROUND ART

With the recent increase in the utilization of various electric facilities and electronic applied equipment, electromagnetic interference (EMI) has been increasing significantly. Such EMI not only induces erroneous operations and troubles on electronic/electric equipment but also is pointed out to cause troubles on the health of operators of such equipment. It is therefore required, in such electronic/electric equipment, to restrict an intensity of an electromagnetic emission within a standard or regulated range.

As a countermeasure against the aforementioned EMI, shielding of the electromagnetic wave is required. This can be achieved utilizing a property of metal not allowing the electromagnetic wave to penetrate. For example, there are employed a method of forming a casing with a metal or a highly conductive material, a method of inserting a metal plate between circuit boards, and a method of covering a cable with a metal foil. However, in CRT or plasma display panel (PDP) and the like, transparency in the display is required because the operator has to recognize a character or the like displayed on such screen.

For this reason, it is necessary to use a material having both of a high electromagnetic wave shielding property and a good optical transmittance in order to shield electromagnetic waves generated from the front face of a display such as a PDP. As such a material, an electromagnetic wave shielding plate has been used wherein a mesh made of a metal thin film is formed on a surface of a transparent glass or plastic substrate.

By the way, the PDP emits a larger amount of electromagnetic wave in comparison with the CRT, and requires a stronger electromagnetic shielding ability. The electromagnetic shielding ability can be represented, as a simple way, by a surface resistivity. For example, in a translucent electromagnetic shield material for CRTs, there is required a surface resistivity of about 300 $\Omega$/sq ($\Omega$/□, ohm per square) or less, while, in a translucent electromagnetic shield material for PDPs, a surface resistivity of 2.5 $\Omega$/sq or less is required. In particular, for a consumer-use plasma television utilizing the PDPs, an extremely high conductivity of 1.5 $\Omega$/sq or less, more desirably of 0.1 $\Omega$/sq or less, is desired.

With respect to a required level of translucency, the overall visible light transmittance is approximately 70% or more for the CTR, and is 80% or more for PDPs. A much higher transparency is desired.

In order to solve the above-mentioned problems, various materials and methods have been hitherto proposed wherein a metal mesh having openings is used to make electromagnetic wave shielding property (conductivity) and translucency compatible with each other, as described below.

(1) Mesh on which Silver Paste is Printed

For example, JP-A-2000-13088 ("JP-A" means unexamined published Japanese patent application) discloses a method of printing a paste made of silver powder into a net form to yield a silver mesh. However, the silver mesh yielded by this method is large in line width since the mesh is formed by printing; thus, problems such as lowering of transmittance can arise. Moreover, a surface resistance value is high and an electromagnetic wave shielding ability is small. It is therefore necessary to subject the resultant silver mesh to plating process in order to make the electromagnetic wave shielding ability high.

(2) Silver Mesh in Irregular Net Form

For example, JP-A-10-340629 discloses a silver mesh having irregular microscopic network form, and a producing method thereof. However, this producing method has a problem that only a mesh having a large surface resistance value of 10 $\Omega$/sq (low electromagnetic wave shielding ability) is obtained. Additionally, a haze is as large as ten plus several percentage or more, so as to result in a problem that the display images become obscure.

(3) Etched Copper Mesh Formed by Photolithography

There is proposed a method of etching a copper foil by photolithography to form a copper mesh on a transparent substrate, for example, in JP-A-10-41682. This method, because of permitting a micro fabrication of a mesh, provides advantages capable of producing a mesh of a high aperture rate (high transmission), and shielding even a strong electromagnetic wave emission. However, it has a disadvantage that the mesh has to be manufactured through a number of production steps. Further, because of the use of a copper foil, the obtained mesh is not black but has a copper color. Therefore, the method had a problem to cause a decrease in the image contrast of the display equipment. Further, owing to an etching process, a crossing point of the mesh pattern becomes wider than the width of the line portion, and an improvement is being desired in connection with a moire problem.

(4) Conductive Silver Formation Utilizing Silver Salt

In 1,960s, there is proposed a method of forming a conductive thin metallic silver film pattern by a silver salt diffusion transfer process utilizing a silver deposition on a physical development nucleus in JP-B-42-23746 ("JP-B" means examined Japanese patent publication).

According to this method, a photosensitive material having an emulsion layer containing a silver salt is exposed to light and then developed, whereby a silver mesh can be formed. A silver thin film having a resistance of 10 $\Omega$/sq to 100 k$\Omega$/sq is obtained. However, this conductive level is insufficient for PDPs. Thus, even if the silver salt diffusion transferring method was used as it was, it was impossible to obtain a translucent, electromagnetic wave shielding material excellent in optical transmittance and conductivity, which was suitable for shielding electromagnetic waves emitted from an image-displaying face of an electronic display instrument.

As explained above, the prior electromagnetic shield materials and the producing methods therefor have been associated with drawbacks. Further, since such electromagnetic shield materials were very expensive, a reduction in the production cost has been strongly desired.

Further, for the display such as PDP, as a high image luminocity is required, an IQ optical transmittance close to 100% is strongly desired for the electromagnetic shield material. However, an increase in the aperture rate (a proportion of an area without the fine lines constituting the mesh) in the whole area for improving the optical transmittance reduces the conductivity to deteriorate the electromagnetic shielding effect. It is therefore necessary that in order to increase the conductivity, the resultant silver mesh is plated so as to have a low resistance.

In order to decrease the production costs, a method for improving the conductivity without conducting any plating process has been desired.

DISCLOSURE OF INVENTION

In light of such a situation, the present invention has been made. An object of the present invention is to provide a method for producing a conductive film having a high conductivity at low cost.

The inventors of the present invention have made eager investigations so as to find out that the object can be efficiently attained by conductive films described below and producing methods thereof. Thus, the present invention has been accomplished.

(1-1) A method for producing a conductive film, comprising the steps of:
forming, on a support, a conductive metal portion containing a conductive material and a binder; and
bringing the conductive metal portion into contact with vapor.

(1-2) The method for producing a conductive film according to item (1-1), wherein a period for contact with the vapor is 5 minutes or less.

(1-3) The method for producing a conductive film according to item (1-1) or (1-2), wherein the binder is a water-soluble polymer.

(1-4) The method for producing a conductive film according to any one of items (1-1) to (1-3), wherein the conductive film contains a film-curing agent.

(1-5) The method for producing a conductive film according to any one of items (1-1) to (1-4), comprising a step of subjecting the conductive metal portion to smoothing treatment before the vapor contacting step.

(1-6) The method for producing a conductive film according to item (1-5), wherein the smoothing treatment is conducted at a linear pressure of 1,960 N/cm (200 kgf/cm) or more.

(1-7) The method for producing a conductive film according to item (1-5) or (1-6), wherein the smoothing treatment is conducted at a linear pressure of 2,940 N/cm (300 kgf/cm) or more.

(1-8) The method for producing a conductive film according to any one of items (1-5) to (1-7), wherein the smoothing treatment is conducted at a linear pressure of 6,860 N/cm (700 kgf/cm) or less.

(1-9) The method for producing a conductive film according to any one of items (1-1) to (1-8), comprising a step of washing the conductive metal portion with water after the vapor contacting step.

(1-10) The method for producing a conductive film according to any one of items (1-1) to (1-9), wherein the temperature of the vapor is 80° C. or higher.

(1-11) The method for producing a conductive film according to any one of items (1-1) to (1-10), wherein the conductive material is conductive metal fine particles.

(1-12) The method for producing a conductive film according to any one of items (1-1) to (1-11), wherein the vapor is water vapor.

(1-13) The method for producing a conductive film according to any one of items (1-1) to (1-12), wherein the support is a transparent flexible support, and the conductive metal portion is a pattern in a lattice form.

(1-14) A method for producing a conductive film, comprising the steps of:
exposing a photosensitive material having a photosensitive layer containing a photosensitive silver salt and a water-soluble binder on a support to light, and then developing the resultant, thereby forming a conductive metal silver portion on the support; and
bringing the conductive metal silver portion into contact with vapor.

(1-15) The method for producing a conductive film according to item (1-14), wherein the binder is a water-soluble polymer.

(1-16) The method for producing a conductive film according to item (1-14) or (1-15), wherein a film-curing agent is not contained in any layer on the support.

(1-17) The method for producing a conductive film according to any one of items (1-14) to (1-16), comprising a step of subjecting the conductive metal silver portion to smoothing treatment before the vapor contacting step.

(1-18) The method for producing a conductive film according to item (1-17), wherein the smoothing treatment is conducted at a linear pressure of 1,960 N/cm (200 kgf/cm) or more.

(1-19) The method for producing a conductive film according to item (1-17) or (1-18), wherein the smoothing treatment is conducted at a linear pressure of 2,940 N/cm (300 kgf/cm) or more.

(1-20) The method for producing a conductive film according to any one of items (1-17) to (1-19), wherein the smoothing treatment is conducted at a linear pressure of 6,860 N/cm (700 kgf/cm) or less.

(1-21) The method for producing a conductive film according to any one of items (1-14) to (1-20), comprising a step of washing the conductive metal silver portion with water after the vapor contacting step.

(1-22) The method for producing a conductive film according to any one of items (1-14) to (1-21), wherein the temperature of the vapor is 80° C. or higher.

(1-23) The method for producing a conductive film according to any one of items (1-14) to (1-22), wherein the vapor is water vapor.

(1-24) The method for producing a conductive film according to any one of items (1-14) to (1-23), wherein the support is a transparent flexible support, and the conductive metal silver portion is a pattern in a lattice form.

(1-25) A method for producing a conductive film, comprising the steps of: forming, on a support, a conductive metal portion containing conductive metal fine particles; and
bringing the conductive metal portion into contact with vapor.

(1-26) The method for producing a conductive film according to item (1-25), wherein a period for contact with the vapor is 5 minutes or less.

(1-27) The method for producing a conductive film according to item (1-25) or (1-26), comprising a step of subjecting the conductive metal portion to smoothing treatment before the vapor contacting step.

(1-28) The method for producing a conductive film according to item (1-27), wherein the smoothing treatment is conducted at a linear pressure of 1,960 N/cm (200 kgf/cm) or more.

(1-29) The method for producing a conductive film according to item (1-27) or (1-28), wherein the smoothing treatment is conducted at a linear pressure of 2,940 N/cm (300 kgf/cm) or more.

(1-30) The method for producing a conductive film according to any one of items (1-27) to (1-29), wherein the smoothing treatment is conducted at a linear pressure of 6,860 N/cm (700 kgf/cm) or less.

(1-31) The method for producing a conductive film according to any one of items (1-25) to (1-30), comprising a step of washing the conductive metal portion with water after the vapor contacting step.

(1-32) The method for producing a conductive film according to any one of items (1-25) to (1-31), wherein the temperature of the vapor is 80° C. or higher.

(1-33) The method for producing a conductive film according to any one of items (1-25) to (1-32), wherein the vapor is water vapor.

(1-34) The method for producing a conductive film according to any one of items (1-25) to (1-33), wherein the support is a transparent flexible support, and the conductive metal portion is a pattern in a lattice form.

(1-35) A conductive film produced by the method according to any one of items (1-1) to (1-34).

(1-36) A translucent conductive film produced by the method according to item (1-13), (1-24) or (1-34).

(2-1) A method for producing a conductive film, comprising the steps of:
forming, on a support, a conductive metal portion containing a conductive material and a water-soluble binder; and
immersing the conductive metal portion into hot water having a temperature of 40° C. or higher.

(2-2) The method for producing a conductive film according to item (2-1), wherein a period for the immersion into the hot water is 5 minutes or less.

(2-3) The method for producing a conductive film according to item (2-1) or (2-2), wherein the binder is a water-soluble polymer.

(2-4) The method for producing a conductive film according to any one of items (2-1) to (2-3), wherein the temperature of the hot water is 60° C. or higher.

(2-5) The method for producing a conductive film according to any one of items (2-1) to (2-4), wherein the temperature of the hot water is 80° C. or higher.

(2-6) The method for producing a conductive film according to any one of items (2-1) to (2-5), wherein a pH of the hot water is from 2 to 13.

(2-7) The method for producing a conductive film according to any one of items (2-1) to (2-6), wherein the conductive film contains a film-curing agent.

(2-8) The method for producing a conductive film according to any one of items (2-1) to (2-7), comprising a step of subjecting the conductive metal portion to smoothing treatment before the hot water immersion step.

(2-9) The method for producing a conductive film according to item (2-8), wherein the smoothing treatment is conducted at a linear pressure of 1,960 N/cm (200 kgf/cm) or more.

(2-10) The method for producing a conductive film according to item (2-8) or (2-9), wherein the smoothing treatment is conducted at a linear pressure of 2,940 N/cm (300 kgf/cm) or more.

(2-11) The method for producing a conductive film according to any one of items (2-8) to (2-10), wherein the smoothing treatment is conducted at a linear pressure of 6,860 N/cm (700 kgf/cm) or less.

(2-12) The method for producing a conductive film according to any one of items (2-1) to (2-11), wherein the conductive material is conductive metal fine particles.

(2-13) The method for producing a conductive film according to any one of items (2-1) to (2-12), wherein the support is a transparent flexible support, and the conductive metal portion is a pattern in a lattice form.

(2-14) A method for producing a conductive film, comprising the steps of:
exposing a photosensitive material having a photosensitive layer containing a photosensitive silver salt and a water-soluble binder on a support to light, and then developing the resultant, thereby forming a conductive metal silver portion on the support; and
immersing the conductive metal silver portion into hot water having a temperature of 40° C. or higher.

(2-15) The method for producing a conductive film according to item (2-14), wherein the binder is a water-soluble polymer.

(2-16) The method for producing a conductive film according to any one of items (2-14) to (2-15), wherein the temperature of the hot water is 60° C. or higher.

(2-17) The method for producing a conductive film according to any one of items (2-14) to (2-16), wherein the temperature of the hot water is 80° C. or higher.

(2-18) The method for producing a conductive film according to any one of items (2-14) to (2-17), wherein the pH of the hot water is from 2 to 13.

(2-19) The method for producing a conductive film according to any one of items (2-14) to (2-18), wherein a film-curing agent is not contained in any layer on the support.

(2-20) The method for producing a conductive film according to any one of items (2-14) to (2-19), comprising a step of subjecting the conductive metal silver portion to smoothing treatment before the hot water immersion step.

(2-21) The method for producing a conductive film according to item (2-20), wherein the smoothing treatment is conducted at a linear pressure of 1,960 N/cm (200 kgf/cm) or more.

(2-22) The method for producing a conductive film according to item (2-20) or (2-21), wherein the smoothing treatment is conducted at a linear pressure of 2,940 N/cm (300 kgf/cm) or more.

(2-23) The method for producing a conductive film according to any one of items (2-20) to (2-22), wherein the smoothing treatment is conducted at a linear pressure of 6,860 N/cm (700 kgf/cm) or less.

(2-24) The method for producing a conductive film according to any one of items (2-14) to (2-23), wherein the support is a transparent flexible support, and the conductive metal silver portion is a pattern in a lattice form.

(2-25) A method for producing a conductive film, comprising the steps of:
forming, on a support, a conductive metal portion containing conductive metal fine particles; and
immersing the conductive metal portion into hot water having a temperature of 40° C. or higher.

(2-26) The method for producing a conductive film according to item (2-25), wherein a period for immersion into the hot water is 5 minutes or less.

(2-27) The method for producing a conductive film according to item (2-25) or (2-26), wherein the temperature of the hot water is 60° C. or higher.

(2-28) The method for producing a conductive film according to any one of items (2-25) to (2-27), wherein the temperature of the hot water is 80° C. or higher.

(2-29) The method for producing a conductive film according to any one of items (2-25) to (2-28), comprising a step of subjecting the conductive metal portion to smoothing treatment before the hot water immersion step.

(2-30) The method for producing a conductive film according to item (2-29), wherein the smoothing treatment is conducted at a linear pressure of 1,960 N/cm (200 kgf/cm) or more.

(2-31) The method for producing a conductive film according to item (2-29) or (2-30), wherein the smoothing treatment is conducted at a linear pressure of 2,940 N/cm (300 kgf/cm) or more.

(2-32) The method for producing a conductive film according to any one of items (2-29) to (2-31), wherein the smoothing treatment is conducted at a linear pressure of 6,860 N/cm (700 kgf/cm) or less.

(2-33) The method for producing a conductive film according to any one of items (2-25) to (2-32) wherein the support is a transparent flexible support, and the conductive metal portion is a pattern in a lattice form.

(2-34) A conductive film produced by the method according to any one of items (2-1) to (2-33).

(2-35) A translucent conductive film produced by the method according to item (2-13), (2-24) or (2-33).

(3-1) A method for producing a conductive film, comprising the steps of:
forming, on a support, a conductive metal portion containing a conductive material and a water-soluble binder; and
subjecting the support on which the conductive metal portion is formed to a hygrothermal treatment to allow said support to stand still in an atmosphere kept under a humidity-adjusted condition that a temperature is 40° C. or higher and a relative humidity is 5% or more.

(3-2) The method for producing a conductive film according to item (3-1), wherein the temperature under the humidity-adjusted condition is 60° C. or higher.

(3-3) The method for producing a conductive film according to item (3-1) or (3-2), wherein the temperature under the humidity-adjusted condition is 80° C. or higher.

(3-4) The method for producing a conductive film according to any one of items (3-1) to (3-3), wherein the relative humidity under the humidity-adjusted condition is 60% or more.

(3-5) The method for producing a conductive film according to any one of items (3-1) to (3-4), wherein the relative humidity under the humidity-adjusted condition is 80% or more.

(3-6) The method for producing a conductive film according to any one of items (3-1) to (3-5), wherein a period for the treatment in the hygrothermal treatment step is 60 minutes or less.

(3-7) The method for producing a conductive film according to any one of items (3-1) to (3-6), wherein a period for the treatment in the hygrothermal treatment step is 30 minutes or less.

(3-8) The method for producing a conductive film according to any one of items (3-1) to (3-7), wherein a period for the treatment in the hygrothermal treatment step is 10 minutes or less.

(3-9) The method for producing a conductive film according to any one of items (3-1) to (3-8), including a smoothing treatment step of subjecting the conductive metal portion to smoothing treatment before the hygrothermal treatment step.

(3-10) The method for producing a conductive film according to item (3-9), wherein the smoothing treatment is conducted at a linear pressure of 1,960 N/cm (200 kgf/cm) or more.

(3-11) The method for producing a conductive film according to item (3-9) or (3-10), wherein the smoothing treatment is conducted at a linear pressure of 2,940 N/cm (300 kgf/cm) or more.

(3-12) The method for producing a conductive film according to any one of items (3-9) to (3-11), wherein the smoothing treatment is conducted at a linear pressure of 6,860 N/cm (700 kgf/cm) or less.

(3-13) The method for producing a conductive film according to any one of items (3-1) to (3-12), wherein the conductive material is made of conductive metal fine particles.

(3-14) The method for producing a conductive film according to any one of items (3-1) to (3-13), wherein the support is a transparent flexible support, and the conductive metal portion is a pattern in a lattice form.

(3-15) A method for producing a conductive film, comprising the steps of:
exposing a photosensitive material having a photosensitive layer containing a photosensitive silver salt and a water-soluble binder on a support to light, and then developing the resultant, thereby forming a conductive metal silver portion on the support; and
subjecting the support on which the conductive metal silver portion is formed to a hygrothermal treatment to allow said support to stand still in an atmosphere kept under a humidity-adjusted condition that a temperature is 40° C. or higher and a relative humidity is 5% or more.

(3-16) The method for producing a conductive film according to item (3-15), wherein the temperature under the humidity-adjusted condition is 60° C. or higher.

(3-17) The method for producing a conductive film according to item (3-15) or (3-16), wherein the temperature under the humidity-adjusted condition is 80° C. or higher.

(3-18) The method for producing a conductive film according to any one of items (3-15) to (3-17), wherein the relative humidity under the humidity-adjusted condition is 60% or more.

(3-19) The method for producing a conductive film according to any one of items (3-15) to (3-18), wherein the relative humidity under the humidity-adjusted condition is 80% or more.

(3-20) The method for producing a conductive film according to any one of items (3-15) to (3-19), wherein the binder is a water-soluble polymer.

(3-21) The method for producing a conductive film according to any one of items (3-15) to (3-20), wherein a film-curing agent is not contained in any layer on the support.

(3-22) The method for producing a conductive film according to any one of items (3-15) to (3-21), comprising a step of subjecting the conductive metal silver portion to smoothing treatment before the hygrothermal treatment step.

(3-23) The method for producing a conductive film according to item (3-22), wherein the smoothing treatment is conducted at a linear pressure of 1,960 N/cm (200 kgf/cm) or more.

(3-24) The method for producing a conductive film according to item (3-22) or (3-23), wherein the smoothing treatment is conducted at a linear pressure of 2,940 N/cm (300 kgf/cm) or more.

(3-25) The method for producing a conductive film according to any one of items (3-22) to (3-24), wherein the smoothing treatment is conducted at a linear pressure of 6,860 N/cm (700 kgf/cm) or less.

(3-26) The method for producing a conductive film according to any one of items (3-15) to (3-25), wherein the support is a transparent flexible support, and the conductive metal silver portion is a pattern in a lattice form.

(3-27) A method for producing a conductive film, comprising the steps of:
forming, on a support, a conductive metal portion containing conductive metal fine particles; and subjecting the support on which the conductive metal portion is formed to a hygrothermal treatment to allow said support to stand still in an atmosphere kept under a humidity-adjusted condition that a temperature is 40° C. or higher and a relative humidity is 5% or more.

(3-28) The method for producing a conductive film according to item (3-27), wherein the temperature under the humidity-adjusted condition is 60° C. or higher.

(3-29) The method for producing a conductive film according to item (3-27) or (3-28), wherein the temperature under the humidity-adjusted condition is 80° C. or higher.

(3-30) The method for producing a conductive film according to any one of items (3-27) to (3-29), wherein the relative humidity under the humidity-adjusted condition is 60% or more.

(3-31) The method for producing a conductive film according to any one of items (3-27) to (3-30), wherein the relative humidity under the humidity-adjusted condition is 80% or more.

(3-32) The method for producing a conductive film according to any one of items (3-27) to (3-31), wherein a period for the treatment in the hygrothermal treatment step is 60 minutes or less.

(3-33) The method for producing a conductive film according to any one of items (3-27) to (3-32), wherein a period for the treatment in the hygrothermal treatment step is 30 minutes or less.

(3-34) The method for producing a conductive film according to any one of items (3-27) to (3-33), wherein a period for the treatment in the hygrothermal treatment step is 10 minutes or less.

(3-35) The method for producing a conductive film according to any one of items (3-27) to (3-34), comprising a step of subjecting the conductive metal portion to smoothing treatment before the hygrothermal treatment step.

(3-36) The method for producing a conductive film according to item (3-35), wherein the smoothing treatment is conducted at a linear pressure of 1,960 N/cm (200 kgf/cm) or more.

(3-37) The method for producing a conductive film according to item (3-35) or (3-36), wherein the smoothing treatment is conducted at a linear pressure of 2,940 N/cm (300 kgf/cm) or more.

(3-38) The method for producing a conductive film according to any one of items (3-35) to (3-37), wherein the smoothing treatment is conducted at a linear pressure of 6,860 N/cm (700 kgf/cm) or less.

(3-39) The method for producing a conductive film according to any one of items (3-27) to (3-38), wherein the support is a transparent flexible support, and the conductive metal portion is a pattern in a lattice form.

(3-40) A conductive film produced by the method according to any one of items (3-1) to (3-39).

(3-41) A translucent conductive film produced by the method according to item (3-14), (3-26) or (3-39).

(4-1) A conductive film comprising, on a support, a conductive metal portion containing a conductive material and a binder, wherein the following formula (1) is satisfied, when a density of the conductive material in the conductive metal portion is represented by A, a density of the binder in the conductive metal portion is represented by B, and a volume resistance of the conductive metal portion is represented by C:

[Numerical Formula 1]

$$C \leqq 1013.9 \times e^{-0.6137 \times \{A/(A+B)\}} \quad (1)$$

(4-2) The conductive film according to item (4-1), wherein the conductive material is metal silver.

(4-3) The conductive film according to item (4-1) or (4-2), wherein the binder is a water-soluble polymer.

(4-4) The conductive film according to any one of items (4-1) to (4-3), wherein the support is a thermoplastic resin film.

(4-5) The method for producing a conductive film according to any one of items (4-1) to (4-4), wherein the support is a transparent flexible support, and wherein the conductive metal portion is a pattern in a lattice form.

Hereinafter, the methods for producing a conductive film recited in items (1-1) to (1-36) are collectively referred to as a first embodiment of the present invention; the methods for producing a conductive film recited in items (2-1) to (2-35) are collectively referred to as a second embodiment of the present invention; the methods for producing a conductive film recited in items (3-1) to (3-41) are collectively referred to as a third embodiment of the present invention; and the conductive films recited in items (4-1) to (4-5) are collectively referred to as a fourth embodiment of the present invention.

In the present specification, the wording "hot water" refers to water having a temperature of 40° C. or higher. The word "vapor" refers to saturated vapor or heated vapor having a temperature of 80° C. or higher. Examples of a material which may be turned into the vapor include water and organic solvents (specifically, alcohols, ethers and others). The organic solvent may be any organic solvent as far as the support is not dissolved in the solvent. Of these examples, water vapor is preferred. In the specification, the vapor may be steam. The "humidity" refers to relative humidity.

Other and further features and advantages of the present invention will appear more fully from the following description, appropriately referring to the accompanying drawings.

BRIEF DESCRIPTION OF DRAWINGS

FIG. 2(a), FIG. 2(b) and FIG. 2(c) show particles after a developing treatment, after a calendering treatment and after a vapor contacting treatment, respectively.

BEST MODE FOR CARRYING OUT THE PRESENT INVENTION

Figure 1:
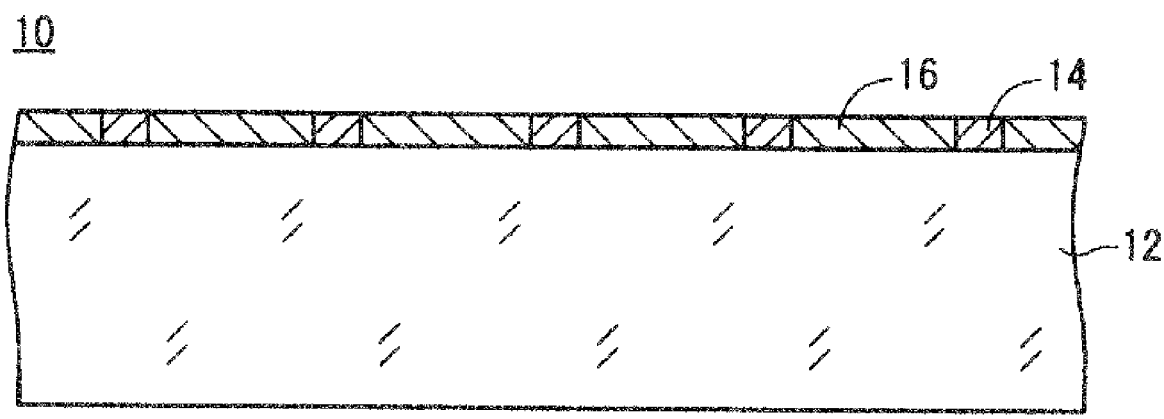
FIG. 1 is a sectional view of a preferred embodiment of an electromagnetic wave shielding film wherein a conductive film of the present invention is used.

The method for producing a conductive film of the present invention is characterized by having the step of forming, on a support, a conductive metal portion containing a conductive material and a binder, and immersing the conductive metal portion into hot water having a temperature of 40° C. or higher, or bringing the conductive metal portion into contact with vapor.

In a conventional production of a conductive film, a binder as described above is necessary for forming a conductive metal portion onto a support; however, the binder is a factor of hindering bonding between conductive materials to lower the conductivity. When gelatin is used as this binder, the film yellows or discolors with the passage of time to result in a problem that a fall in transparency is caused.

The present invention is an invention that has been made on the basis of a finding that when a conductive metal portion is immersed into hot water having a temperature of 40° C. or higher, or is brought into contact with vapor, a conductive film having an improved conductivity can be produced. The reason why the conductivity of the conductive film improves is unclear. However, it appears that at least one part of the binder is removed so that bonding moieties between metal (conductive material) particles increase. In this case, it is considered that the binder used for the bonding between the support and the conductive metal portion is not removed but an extra of the binder which is present between the metals is removed.

As preceding techniques for removing a binder, there are known a method of using ultrasonic vibration in the field of powder-molding (for example, JP-A-5-163504), a method of using an acidic gas (for example, JP-A-5-78177), and others. In any one of the techniques, much time is required. Known is also a method of burning a silver salt at 300 to 400° C. to incinerate the binder (for example, JP-A-51-16925). However, a high temperature is required, and the plastic film support is also melted together. None of the techniques is a technique of removing the binder in order to improve the conductivity of a conductive film.

Hereinafter, the present invention will be described in detail.

In the present specification, "to" denotes a range including numerical values described before and after it as a minimum value and a maximum value.

In the method of the present invention, a conductive metal portion composed of a conductive material and a binder is first formed on a support. The conductive film formed by the present invention is preferably a translucent film; however, the film is not limited thereto.

The support that can be used may be equivalent to a support for photosensitive material that will be described later, or may be a plastic film (thermoplastic resin film), a plastic plate, a glass plate, or some other support. Of these supports, preferred is a support having transparency, for example, a transparent flexible support. The film thickness of the support is preferably 200 μm or less, more preferably 100 μm or less from the viewpoint of flexibility.

The conductive material may be copper, silver, aluminum, indium tin oxide (ITO), or some other material, and is in particular preferably silver, The particle diameter thereof is preferably 500 Mm or less, more preferably 300 μm or less. In the case of using conductive metal fine particles having nanometer sizes, the conductivity-improving effect in the vapor treatment step, the hot water immersion step, and the hygrothermal treatment step is particularly excellent. A specific example of the conductive material is silver paste (silver nano-paste in the case of using nanometer-size conductive metal fine particles). Silver paste is a conductive pasty material (paste) obtained by dispersing silver particles having predetermined particle diameters into an appropriate solvent such as a resin binder, and is used for adhesion of a sample, for conductive treatments and for other purposes. A commercially available product thereof is, for example, PELTRON K-3424LB (trade name, manufactured by Pelnox, Ltd.). In the case of using the silver nano-paste, the shape of the conductive material particles is, for example, a granular shape or a needle shape. With respect to the size thereof, the average particle diameter represented as sphere-converted diameter is preferably 25 μm or less, more preferably 1000 nm or less. The lower limit thereof is 10 nm or more.

As the binder, binders that will be described below may be used. The binder is preferably a water-soluble polymer. With respect to the amount of the binder to be used, the ratio by volume of the conductive material to the binder is preferably ¼ or more, more preferably ⅓ or more.

When the density of the conductive material in the conductive metal portion is represented by A, the density of the binder in the conductive metal portion is represented by B, and the volume resistance of the conductive metal portion is represented by C, the volume resistance of the conductive metal portion preferably satisfies formula (1) described below. The density of the conductive material and the density of the binder may be obtained from addition amounts of silver and gelatin or carrageenan in the application. The volume resistance of the conductive metal portion may be obtained from the surface resistance and the film thickness, using the equation: (the surface resistance)×(the film thickness). The surface resistance and the film thickness may be measured with a resistance measuring device and a section SEM (scanning electron microscope), respectively. The conductive film having this characteristic is obtained by the producing method of the present invention having the vapor contacting step, the hot water immersion step or the hygrothermal treatment step. As illustrated, for example, in FIG. 2, the conductive metal which is in a granular form after developed undergoes a vapor treatment, a hot water treatment or a hygrothermal treatment, whereby melted and bonded particles of the conductive metal are obtained.

[Numerical Formula 2]

$$C \leq 1013.9 \times e^{-06137 \times \{A/(A+B)\}} \tag{1}$$

The method for forming the conductive metal portion, which is composed of a conductive material and a binder, may be adhering (bonding) or some other method in addition to a method using a photosensitive material, which will be described later. Herein, the adhering means that a fine-line structural portion, in a net form, made of a metal and/or an alloy and a transparent conductive film are separately formed and then they are superimposed onto each other, thereby producing a transparent conductive film of the present invention. In short, a fine-line structural portion made of a metal and/or an alloy and a transparent conductive film may be superimposed onto each other. The conductive metal portion may be formed by printing. The printing may be screen printing or gravure printing. Specifically, methods described in the following may be used: JP-A-11-170420, JP-A-2003-109435, JP-A-2007-281290, and a pamphlet of International Publication WO2007/119707A1.

Hereinafter, a method using a photosensitive material will be described, as preferred method for forming a conductive metal portion composed of a conductive material and a binder. According to this method, a photosensitive material having a photosensitive layer containing a photosensitive silver salt and a binder on a support is exposed to light, and then developed, thereby forming a conductive metal silver portion and an optically transmissible portion on the support.

<Photosensitive Material for Making a Conductive Film>
[Substrate]

A substrate for the photosensitive material to be employed in the producing method of the present invention can be, for example, a plastic film, a plastic plate or a glass plate.

A raw material for the above-mentioned plastic film or the plastic plate can be, for example, polyesters such as polyethylene terephthalate (PET), or polyethylene naphthalate (PEN); polyolefins such as polyethylene (PE), polypropylene (PP), polystyrene or EVA; vinylic-series resins such as polyvinyl chloride, or polyvinylidene chloride; polyether ether ketone (PEEK), polysulfone (PSF), polyethersulfone (PES), polycarbonate (PC), polyamide, polyimide, acrylic resin, or triacetyl cellulose (TAC).

The plastic film or the plastic plate in the present invention may be employed in a single layer or as a multi-layered film by combining two or more layers. A foil piece made of a metal such as aluminum may be used as a base.

The support is preferably a film or plate made of a plastic having a melting point of about 290° C. or lower, such as PET (258° C.), PEN (269° C.), PE (135° C.), PP (163° C.), polystyrene (230° C.), polyvinyl chloride (180° C.), polyvinylidene chloride (212° C.), or TAC (290° C.). PET is particularly preferred for a translucent film for shielding electromagnetic waves from the viewpoint of light transmittance and workability.

It is preferred that the transparency of the support is high since transparency is required for any transparent conductive film. In such a case, the plastic film or the plastic plate preferably has a transmittance in the entire visible region of 70 to 100%, more preferably 85 to 100%, and particularly preferably 90 to 100%. Further, in the present invention, the plastic film or the plastic plate may be colored to an extent not hindering the objects of the present invention.

The plastic film or the plastic plate in the present invention may be employed in a single layer or as a multi-layered film by combining two or more layers.

In case of employing a glass plate as the substrate in the present invention, it is not particularly restricted in its type, but, for a conductive film for a display, there is preferably employed a tempered glass having a tempered layer on the surface. The tempered glass has a higher possibility of breakage prevention in comparison with an untempered glass. Further, the tempered glass obtained by an air cooling method gives, even in the unlikely event that the glass damages, small fragments with unsharp edges, and is preferable for safety.

[Emulsion Layer (Silver Salt-Containing Layer)]

The photosensitive material to be employed in the producing method of the present invention has, on the substrate, an emulsion layer containing a silver salt as a photosensor (silver salt-containing layer). The photosensitive emulsion layer containing the silver salt may contain, in addition to the silver salt and a binder, a dye, a solvent and the like.

Moreover, the emulsion layer is preferably arranged substantially on the topmost layer. The wording "the emulsion layer is arranged substantially on the topmost layer" means not only a case where the emulsion layer is actually arranged as the topmost layer but also a case where the total film thickness of one or more layers arranged on the emulsion layer is 0.5 μm or less. The total film thickness of the layer(s) arranged on the emulsion layer is preferably 0.2 μm or less.

Hereinafter, each of components contained in the emulsion layer will be described.

<Dye>

The photosensitive material may contain a dye at least in the emulsion layer. The dye is included in the emulsion layer as a filter dye, or for various purposes such as prevention of irradiation. The dye may include a solid dispersed dye. Dyes preferably employed in the present invention include those represented by formulae (FA), (FA1), (FA2) and (FA3) in JP-A-9-179243, more specifically compounds F1-F34 described therein. There can also be advantageously employed compounds (II-2) to (II-24) described in JP-A-7-152112, compounds (III-5) to (III-18) described in JP-A-7-152112 and compounds (IV-2) to (IV-7) described in JP-A-7-152112.

Further, the dyes employable in the present invention include, as a dye in a dispersed state of solid fine particles to be discolored at the developing or fixing process, a cyanine dye, a pyrylium dye and an aminium dye described in JP-A-3-138640.

Further, as a dye not discolored at the processing, there can be employed a cyanine dye having a carboxyl group described in JP-A-9-96891, a cyanine dye not containing an acidic group described in JP-A-8-245902 and a lake type cyanine dye described in JP-A-8-333519, a cyanine dye described in JP-A-1-266536, a holopola type cyanine dye described in JP-A-3-136038, a pyrylium dye described in JP-A-62-299959, a polymer-type cyanine dye described in JP-A-7-253639, a solid fine particle dispersion of an oxonol dye described in JP-A-2-282244, light scattering particles described in JP-A-63-131135, a $Yb^{3+}$ compound described in JP-A-9-5913 and an ITO powder described in JP-A-7-113072. There can also be employed dyes represented by formulae (FT) and (F2) described in JP-A-9-179243, more specifically compounds F35 to F112 therein.

Further, a water-soluble dye may be contained in the aforementioned dye. Such water-soluble dye can be an oxonol dye, a benzylidene dye, a merocyanine dye, a cyanine dye or an azo dye. Among these, the oxonol dye, the hemioxonol dye or the benzylidene dye is useful in the present invention. Specific examples of the water-soluble dye employable in the present invention include those described in BP Nos. 584,609 and 1,177,429, JP-A-48-85130, JP-A-49-99620, JP-A-49-114420, JP-A-52-20822, JP-A-59-154439, JP-A-59-208548, and U.S. Pat. Nos. 2,274,782, 2,533,472, 2,956,879, 3,148, 187, 3,177,078, 3,247,127, 3,540,887, 3,575,704, 3,653,905 and 3,718,427.

The content of the dye in the aforementioned emulsion layer is preferably in the range of 0.01 to 10% by mass, and more preferably 0.1 to 5% by mass to the total solid from the viewpoint of effects of an irradiation preventing effect and the like, and a reduction in the sensitivity by an increase in the content.

<Silver Salt>

The silver salt to be employed in the present invention can be an inorganic silver salt such as silver halide, or an organic silver salt such as silver acetate. In the present invention, there is preferably employed the silver halide having an excellent property as a photosensor.

The silver halide advantageously employed in the present invention will be explained.

In the present invention, it is preferable to employ silver halide superior in a property as a photosensor, and technologies of a silver salt photographic film, a photographic paper, a lithographic film, and an emulsion mask for a photomask relating to silver halide are applicable also in the present invention. A halogen element contained in the silver halide may be any of chlorine, bromine, iodine and fluorine or a combination thereof. For example, a silver halide principally formed by silver chloride, silver bromide or silver iodide is employed preferably, and a silver halide principally formed by silver bromide or silver chloride is employed more preferably. Further, silver chlorobromide, silver iodochlorobromide or silver iodobromide can be employed preferably. More preferably there is employed silver chlorobromide, silver bromide, silver iodochlorobromide or silver iodobromide, and most preferably silver chlorobromide or silver iodochlorobromide containing silver chloride by 50 mol % or more.

The term "silver halide principally formed by silver bromide" means silver halide in which bromine ions represent in an amount of the molar ratio of 50% or higher in the composition of the silver halide. Such silver halide particle principally formed by silver bromide may contain iodine ions or chlorine ions in addition to bromine ions.

The content of silver iodide in the silver halide emulsion is preferably not more than 1.5 mol % per mol of the silver halide emulsion. By setting the silver iodide content to not more than 1.5 mol %, fogging is prevented and the pressure property can be improved. The silver iodide content is more preferably 1 mol % or less per mol of the silver halide emulsion.

Silver halide is in a state of solid particles, and, from the viewpoint of an image quality of a patterned metallic silver layer formed after the exposure and the developing treatment, preferably has an average particle size of 0.1 to 1000 nm (1 μm) in a sphere-corresponding diameter, more preferably 0.1 to 100 nm, and further preferably 1 to 50 nm.

The sphere-corresponding diameter of silver halide particle means a diameter of a spherical particle of the same volume.

The silver halide particle is not particularly restricted in its shape, and may have various shapes such as spherical, cubic, planar (hexagonal flat plate, triangular flat plate or tetragonal flat plate), octahedral or tetradecahedral, preferably cubic or tetradecahedral.

In the silver halide particle, an interior and a surface layer may be formed by a uniform phase or of different phases. Also it may include a localized layer of a different halogen composition, in the interior or on the surface of the particle.

The silver halide emulsion employed for forming the emulsion layer of the present invention is preferably a monodispersion emulsion, having a coefficient of variance represented by {(standard deviation of particle size)/(average particle size)}×100, of 20% or less, more preferably 15% or less and most preferably 10% or less.

The silver halide emulsion employed in the present invention may also be a mixture of plural silver halide emulsions of different particle sizes.

The silver halide emulsion to be employed in the present invention may contain a metal belonging to a group VIII or VIIB of the periodic table. Particularly for attaining a high contrast and a low fog level, it is preferable to include a rhodium compound, an iridium compound, a ruthenium compound, an iron compound or an osmium compound. Such compound can be a compound having various ligands, which can be, for example, a cyanide ion, a halide ion, a thiocyanate ion, a nitrosyl ion, water or a hydroxide ion, and which can also be an organic molecule for example an amine (such as methylamine or ethylenediamine), a heterocyclic compound (such as imidazole, thiazole, 5-methylthiazole or mercaptoimidazole), urea or thiourea in addition to such pseudo halogen, ammonia.

Further, for attaining a high sensitivity, there is advantageously employed a doping with a hexacyano metal complex such as $K_4[Fe(CN)_6]$, $K_4[Ru(CN)_6]$, or $K_3[Cr(CN)_6]$.

The rhodium compound can be a water-soluble rhodium compound, of which examples include a rhodium (III) halide, a hexachlororhodium (III) complex salt, a pentachloroaquorhodium complex salt, a tetrachlorodiaquorhodium complex salt, a hexabromorhodium (III) complex salt, a hexaamminerhodium (III) complex salt, a trisalatorhodium (III) complex salt, and $K_3Rh_2Br_9$.

Such rhodium compound is employed by dissolving in water or a suitable solvent, and a common method for stabilizing the solution of the rhodium compound, namely a method of adding an aqueous solution of a hydrogen halide (such as hydrochloric acid, hydrobromic acid or hydrofluoric acid) or an alkali halide (such as KCl, NaCl, KBr or NaBr), can be utilized. It is also possible, instead of employing the water-soluble rhodium compound, to add and dissolve, at the preparation of silver halide, other silver halide particles doped with rhodium in advance.

Further, in the present invention, silver halide containing a Pd (II) ion and/or a Pd metal can be employed advantageously. Pd may be uniformly distributed within a silver halide particle, but is preferably included in the vicinity of a surface layer of the silver halide particle. The expression that Pd is "included in the vicinity of a surface layer of the silver halide particle" means that the silver halide particle has a layer with a higher palladium content than in other layers, within a depth of 50 nm from the surface of the silver halide particle.

Such silver halide particle can be prepared by adding Pd in the course of formation of the silver halide particle, and it is preferable to add Pd after silver ions and halogen ions are added by more than 50% of the total addition amounts. Further, Pd (II) ions may be advantageously made present in the surface layer of silver halide by adding Pd (II) ions in a post-aging stage.

Such Pd-containing silver halide particles increases a speed of a physical development or an electroless plating to improve the production efficiency of the desired electromagnetic shield material, thereby contributing to a reduction of the production cost. Pd is well known and employed as a catalyst for an electroless plating, and, in the present invention, it is possible to localize Pd in the surface layer of the silver halide particles, thereby enabling to save extremely expensive Pd.

In the present invention, Pd ions and/or Pd metal preferably has a rate of content in the silver halide, of $10^{-4}$ to 0.5 mole/mol Ag with respect to a number of moles of silver in silver halide, more preferably 0.01 to 0.3 mole/mol Ag.

The Pd compound to be employed can be, for example, $PdCl_4$ or $Na_2PdCl_4$.

In the present invention, chemical sensitization may or may not be conducted in the same manner as for ordinary silver halide photographic photosensitive material. The method for the chemical sensitization may be conducted by adding a chemical sensitizer made of a chalcogenide compound or noble metal compound having a sensitizing effect onto photographic photosensitive material, to the silver halide emulsion, this addition method being cited in or after the paragraph 0078 of JP-A-2000-275770. The silver salt emulsion used in the photosensitive material in the present invention is preferably an emulsion to which such chemical sensitization is not applied, that is, a chemically-unsensitized emulsion. In a method for preparing chemically-unsensitized emulsion, which is preferred for the present invention, it is preferred to control the addition amount of the chemical sensitizer, which is made of a chalcogenide compound or a noble metal compound, into not more than an amount which does not permit a rise in the sensitivity based on the addition of this agent to be more than 0.1. A specific value of the addition amount of the chalcogenide or noble metal compound is not limited. In a preferred method for preparing the chemically unsensitized emulsion in the present invention, the total addition amount of the chemically sensitizing compound(s) is preferably set to $5\times10^{-7}$ mol or less per mol of the silver halide.

<Binder>

In the emulsion layer, a binder is used to disperse the silver salt particles evenly and further aiding the adhesion between the emulsion layer and the support. The binder used in the present invention may be a binder that can be removed by the hot water immersion treatment, vapor contacting treatment or hygrothermal treatment, which will be detailed later. As such binder, a water-soluble polymer is preferably used.

Examples of the binder include gelatin, carrageenan, polyvinyl alcohol (PVA), polyvinyl pyrrolidone (PVP), polysaccharides such as starch, cellulose and derivatives thereof, polyethylene oxide, polysaccharide, polyvinyl amine, chitosan, polylysine, polyacrylic acid, polyalginic acid, polyhyaluronic acid, carboxycellulose, gum arabic, and sodium alginate. These materials have a neutral, anionic or cationic property depending on the ionic property of the functional group.

As the gelatin, in addition to lime-treated gelatin, acid-treated gelatin can be used. Further there may be used a hydrolyzed product of gelatin, an enzymatically-decomposed product of gelatin, or gelatin modified with amino groups or carboxyl groups (phthalated gelatin or acetylated gelatin).

The amount of the binder contained in the emulsion layer is not particularly restricted, and can be suitably selected within a range of meeting the dispersibility and the adhesion. As for the binder content in the emulsion layer, the ratio by volume of Ag to the binder is preferably ½ or more, more preferably ¹⁄₁ or more.

<Solvent>

A solvent to be employed in forming the emulsion layer is not particularly restricted, and can be, for example, water, an organic solvent (for example an alcohol such as methanol, a ketone such as acetone, an amide such as formamide, a sulfoxide such as dimethyl sulfoxide, an ester such as ethyl acetate, or an ether), an ionic liquid or a mixture thereof.

The content of the solvent to be used in the emulsion layer of the present invention is in the range of 30 to 90% by mass with respect to the total mass of the silver salt, the binder and the like contained in the emulsion layer, preferably in the range of 50 to 80% by mass.

<Antistatic Agents>

The photosensitive material related to the present invention preferably contains an antistatic agent, and the agent is desirably coated onto the support surface opposite to the emulsion layer.

The antistatic agent layer is preferably a conductive-material-containing layer having a surface resistivity of $10^{12}\Omega$ or less in an atmosphere of 25° C. in temperature and 25% in RH. Examples of the antistatic agent that can be preferably used in the present invention include the following conductive materials:

Examples thereof include the conductive materials described on page 2, lower left, line 13 to page 3, upper right, line 7 of JP-A-2-18542. More specifically, metal oxides described on page 2, lower right, line 2 to line 10 of the above specification, conductive polymeric compounds P-1 to P-7 described in the above specification, and acicular metal oxides described in U.S. Pat. No. 5,575,957, paragraphs 0045 to 0043 of JP-A10-142738 and paragraphs 0013 to 0019 of JP-A-11-23901 can be used.

Examples of the conductive metal oxide particles used in the present invention include ZnO, $TiO_2$, $SnO_2$, $Al_2O_3$, $In_2O_3$, MgO, BaO and $MoO_3$ particles; particles of any multiple oxide thereof; and particles of a metal oxide obtained by incorporating, into such a metal oxide, a different atom. Preferred examples of the metal oxide include $SnO_2$, ZnO, $Al_2O_3$, $TiO_2$, $In_2O_3$, and MgO, $SnO_2$, ZnO, $In_2O_3$ and $TiO_2$ are more preferred, and $SnO_2$ is particularly preferred. Examples of the oxide containing a different atom in a small amount include ZnO doped with Al or In, $TiO_2$ doped with Nb or Ta, $In_2O_3$ doped with Sn, and $SnO_2$ doped with Sb, Nb, a halogen element, or some other element, the amount of such a different element being from 0.01 to 30% by mol (preferably 0.1 to 10% by mol). If the addition amount of the different element is less than 0.01% by mol, a sufficient conductivity cannot be easily given to the oxide or the multiple oxide. If the amount is more than 30% by mol, the blackness of the particles increases so that the antistatic layer unfavorably gets blackish. Accordingly, in the present invention, the material of the conductive metal oxide particles is preferably a material wherein a metal oxide or multiple metal oxide contains a different element in a small amount. A material having oxygen defects in a crystalline structure is also preferably used.

The conductive metal oxide particles containing the above different atom in a small amount are preferably $SnO_2$ particles doped with antimony, in particular preferably $SnO_2$ particles doped with antimony in an amount of 0.2 to 2.0% by mol.

The shape of the conductive metal oxide used in the present invention is not particularly limited, and examples thereof include granular and needle shapes. As for the size thereof, the sphere-converted diameter is preferably from 0.5 nm to 25 µm.

In order to obtain conductivity, for example, the following may also be used: a soluble salt (such as a chloride or a nitrate), an vapor-deposited metal layer, an ionic polymer as described in U.S. Pat. Nos. 2,861,056 and 3,206,312, or an insoluble inorganic salt as described in U.S. Pat. No. 3,428,451.

The antistatic layer, which contains such conductive metal oxide particles, is preferably formed as an undercoat layer for a back surface, an undercoat layer for the emulsion layer, or the like. The addition amount thereof is preferably from 0.01 to 1.0 g/m² as the total amount on both of the surfaces.

The internal resistivity of the photosensitive material is preferably from $1.0 \times 10^7$ to $1.0 \times 10^{12} \Omega$ in an atmosphere of 25° C. in temperature and 25% in relative humidity.

In the present invention, in addition to the above-mentioned conductive material, the fluorine-containing surfactants described on page 4, upper right, line 2 to page 4, lower right, line 3 from the bottom of JP-A-2-18542, and on page 12, lower left, line 6 to page 13, lower right, line 5 of JP-A-3-39948 can be used, thereby further improving the antistatic properties.

<Other Additives>

Various additives to be employed in the photosensitive material of the present invention are not particularly restricted, and those described, for example, in the following literatures can be employed advantageously. In the present invention, however, it is preferred not to use any film curing agent. When the film curing agent is used, the resistance rises and the conductivity lowers when the hot water immersion treatment, vapor contacting treatment or hygrothermal treatment, which will be detailed later, is conducted.

1) Nucleation Promoter

As the above-mentioned nucleation promoter, there can be exemplified compounds of formulae (I), (II), (III), (IV), (V) and (VI) described in JP-A-6-82943, or those represented by formulae (II-m) to (II-p) in JP-A-2-103536, page 9, upper right column, line 13 to page 16, upper left column, line 10 and in compound examples 11-1 to II-22 therein and described in JP-A-1-179939.

2) Spectral Sensitizing Dye

As the above-mentioned spectral sensitizing dye, there can be exemplified those described in JP-A-2-12236, page 8, lower left column, line 13 to lower right column, line 4, JP-A-2-103536, page 16, lower right column, line 3 to page 17, lower left column, line 20, and those described in JP-A-1-112235, JP-A-2-124560, JP-A-3-7928 and JP-A-5-11389.

3) Surfactant

As the above-mentioned surfactant, there can be exemplified those described in JP-A-2-12236, page 9, upper right column, line 7 to lower right column, line 7, and JP-A-2-18542, page 2, lower left column, line 13 to page 4, lower right column, line 18.

4) Antifoggant

As the above-mentioned antifoggant, there can be exemplified a thiosulfinic acid compound described in JP-A-2-

103536, page 17, lower right column, line 19 to page 18, upper right column, line 4, also in page 18, lower right column lines 1 to 5, and in JP-A-1-237538.

5) Latex Polymer

As the above-mentioned latex polymer, there can be exemplified that described in JP-A-2-103536, page 18, lower left column, lines 12-20.

6) Compound Having Acid Group

As the above-mentioned compound having an acid group, there can be exemplified a compound described in JP-A-2-103536, page 18, lower right column, line 6 to page 19, upper left column, line 1.

7) Black Pepper Spot Preventing Agent

A black pepper spot preventing agent is a compound for suppressing a spot-shaped developed silver in an unexposed area, As the black pepper spot preventing agent, there can be exemplified compounds described, for example, in U.S. Pat. No. 4,956,257 and JP-A-1-118832.

8) Redox Compound

As a redox compound, there can be exemplified compounds represented by formula (1) in JP-A-2-301743 (particularly exemplified compounds 1 to 50), compounds represented by formulae (R-1), (R-2) and (R-3) or exemplified compounds 1 to 75 described in JP-A-3-174143, page 3 to page 20, and compounds described in JP-A-5-257239 and JP-A-4-278939.

9) Monomethine Compound

As the above-mentioned monomethine compound, there can be exemplified compounds described by formula (II) in JP-A-2-287532 (particularly exemplified compounds II-1 to II-26).

10) Dihydroxybenzenes

As the above-mentioned dihydroxybenzene, there can be exemplified compounds described in JP-A-3-39948, page 11, upper left column to page 12, lower left column, and in EP 452772A.

[Other Layer Structures]

A protective layer may be formed on the emulsion layer. In the present invention, the "protective layer" means a layer made from a binder such as gelatin or a polymer, and is formed on the emulsion layer having photosensitivity, for the purposes of preventing scratches and improving mechanical characteristics. The protective layer preferably has a thickness of 0.2 μm or less. A coating method and a forming method for the protective layer is not particularly restricted, and a known coating method can be appropriately selected.

(Method for Forming a Conductive Metal Portion)

A method for forming a conductive metal portion using the above-mentioned photosensitive material is explained.

The conductive film obtained by the present invention may be a film wherein a metal is formed on a support by patterning exposure, or a film wherein a metal is formed thereon by area exposure. Further, in the case of using the conductive film, for example, as a printed circuit board, a metallic silver portion and an insulated portion may be formed.

The method for forming a conductive metal portion in the present invention includes the following three embodiments in accordance with the photosensitive material and the form of the developing treatment thereof:

(1) an embodiment wherein a photosensitive silver halide monochromic photosensitive material containing no physical development nuclei is chemically or thermally developed to form a metallic silver portion on the photosensitive material;

(2) an embodiment wherein a photosensitive silver halide monochromic photosensitive material containing, in its silver halide emulsion layer, physical development nuclei is dissolved and physically developed to form a metallic silver portion on the photosensitive material; and (3) an embodiment wherein a photosensitive silver halide monochromic photosensitive material containing no physical development nuclei is put onto an image-receiving sheet having an optically-insensitive layer containing physical development nuclei so as to attain diffusion transfer development, thereby forming a metallic silver portion on the optically-insensitive image-receiving sheet.

The embodiment (1) is in an integration-type monochromic development mode, and a translucent conductive film, such as a translucent electromagnetic wave shielding film, is formed on the photosensitive material. The resultant developed silver is chemically developed silver or a thermally developed image. The developed silver is high in activity in successive plating or physically developing step since it is made of filaments having a high specific surface.

According to the embodiment (2), in an exposed portion, silver halide particles near the physical development nuclei are dissolved and precipitated on the development nuclei, thereby forming a translucent conductive film such as a translucent electromagnetic wave shielding film or an optically transmissible conductive film on the photosensitive material. This is also in an integration-type monochromatic development mode. Since the developing action is based on precipitation on the physical development nuclei, the effect is highly active; however, the developed silver is in the form of a sphere having a small specific surface area.

According to the embodiment (3), in an unexposed portion, silver halide particles are dissolved and diffused to be precipitated on the development nuclei on the image-receiving sheet, thereby forming a translucent conductive film such as a translucent electromagnetic wave shielding film or an optically transmissible conductive film on the image-receiving sheet. The embodiment is in the so-called separate mode, and is an embodiment wherein the image-receiving sheet is peeled from the photosensitive material and then used.

In any one of the embodiments, any one of a negative developing treatment and a reverse developing treatment may be selected (in the case where a diffusion transfer manner, a negative developing treatment can be attained by using, as the photosensitive material, an automatic positive photosensitive material).

The chemical development, thermal development, dissolution physical development and diffusion transfer development referred to herein have the same meaning as the terms ordinarily used in the art. The terms are explained in ordinary textbooks of photographic chemistry, for example, Shin-ichi Kikuchi "Photographic Chemistry" (published by Kyoritsu Shuppan Co., Ltd.), and "The Theory of Photographic Process 4th ed." published by C. E. K. Mees (published by Mcmillan Co., in 1977). Additionally, for example, techniques described in the following may be referred to: JP-A-2004-184693, JP-A-2004-334077, JP-A-2005-010752, and Japanese Patent Application Nos. 2004-244080 and 2004-085655.

[Exposure]

In the producing method of the present invention, the silver-salt-containing photosensitive layer formed on the support is preferably exposed to light. The exposure may be performed using electromagnetic waves. The exposure can be performed with an electromagnetic radiation. As the electromagnetic wave, there can be exemplified, for example, a visible light, a light such as ultraviolet light, or a radiation such as X-ray. Further, the exposure can be performed with a light source having a wavelength distribution, or a light source of a specified wavelength.

As the above-mentioned light source, for example, there can be exemplified a scanning exposure utilizing a cathode ray tube (CRT). A cathode ray tube exposure apparatus is simpler, more compact and less expensive in comparison with an apparatus utilizing a laser. It also enables easy adjustments of an optical axis and colors. A cathode ray tube employed for image exposure utilizes various light emitting substances showing a light emission in a spectral region according to need. For example, a red light emitting substance, a green light emitting substance or a blue light emitting substance is employed either singly or in a mixture of two or more kinds. The spectral region is not limited to the aforementioned red, green and blue regions, and a light emitting substance, emitting light in a yellow, orange, purple or infrared region, can also be employed. In particular, there is frequently employed a cathode ray tube emitting a white light by mixing these light emitting substances. An ultraviolet lamp is also advantageously employed, and g-line or i-line of a mercury lamp is also utilized.

In the producing method of the present invention, the exposure can be performed with various laser beams. The exposure in the present invention can be preferably performed by a scanning exposure method utilizing monochromatic high-density light of a gas laser, a light-emitting diode, a semiconductor laser, of the second harmonic generator (SHG) formed by a combination of a semiconductor laser or a solid-state laser employing a semiconductor laser as an exciting light source and a non-linear optical crystal. The exposure in the present invention can also utilize a KrF excimer laser, an ArF excimer laser or an F2 laser. For obtaining a compact and inexpensive system, the exposure is preferably performed with the semiconductor laser or the second harmonic generator (SHG) formed by a combination of the semiconductor laser or the solid-state laser and the non-linear optical crystal. In particular, for designing a compact, inexpensive, long-life and highly stable apparatus, the exposure is preferably performed with the semiconductor laser.

Preferred examples of the laser light source include a blue semiconductor laser of a wavelength of 430 to 460 nm (published by Nichia Chemical Co., at 48th United Meeting of Applied Physics (March, 2001); a green light laser of about 530 nm which is obtained by a wavelength conversion of a light of a semiconductor laser (oscillation wavelength of about 1060 nm) by a $LiNbO_3$ SHG crystal having a waveguide-type inverted domain structure; and a red semiconductor laser of a wavelength of about 685 nm (Hitachi type: No. HL6738MG); or a red semiconductor laser of a wavelength of about 650 nm (Hitachi type: No. HL6501MG).

A pattern exposure of the silver salt-containing layer can be performed by a planar exposure utilizing a photomask, or by a scanning exposure with a laser beam. A refractive exposure employing a lens or a reflective exposure employing a mirror may be employed, and there can be utilized a contact exposure, a proximity exposure, a reduced projection exposure or a reflective projection exposure.

[Developing Treatment]

In the producing method of the present invention, a developing treatment is further performed after the exposure of the silver salt-containing layer. The above-mentioned developing treatment can be performed with an ordinary developing technology employed, for example, in a silver halide photographic films, printing paper, films for making printing-plates, emulsion masks for photomasks. A developing solution is not particularly restricted, and can be a PQ developing solution, a MQ developing solution or an MAA developing solution. As a commercial product, there can be used a developing solution or a developing solution in a kit, such as CN-16, CR-56, CP45X, FD-3, or Papitol (each trade name, manufactured by FUJIFILM Corporation), or C-41, E-6, RA-4, Dsd-19 or D-72 (each trade name, manufactured by Eastman Kodak Co., Ltd.) A lith developing solution can also be employed. As the lith developing solution, there can be used D85 (trade name, manufactured by Eastman Kodak Co.) and the like.

In the producing method of the translucent conductive film of the present invention, the exposure and the developing treatment described above form a patterned metallic silver portion in an exposed area, and a light transmitting portion to be explained later in an unexposed area. In the present invention, the developing temperature, the fixing temperature and the water-washing temperature are each preferably 35° C. or lower.

The developing treatment in the producing method of the present invention may include a fixing treatment conducted to remove the silver salt in the unexposed portion and attain stabilization. In the fixing treatment in the producing method of the present invention, there may be used any technique of the fixing treatment used for silver salt photographic films, printing paper, films for making printing-plates, emulsion masks for photomasks, and others.

The developing solution used in the developing treatment may contain an image quality improver in order to improve the image quality. As the image quality improver, there can be exemplified a nitrogen-containing heterocyclic compound such as benzotriazole. In the case of using the lith developing solution, it is particularly preferred to use polyethylene glycol.

The mass of the metallic silver contained in the exposed portion after the developing treatment is preferably 50% or more and more preferably 80% or more with respect to the mass of the silver contained in the exposed portion before the exposure. When the mass of silver contained in the exposed portion is 50% or more with respect to the mass of silver contained in the exposed portion before the exposure, it is favorable because a high conductivity is obtained with ease.

The gradation after the developing treatment in the present invention is not particularly limited, and is preferably more than 4.0. When the gradation is more than 4.0 after the developing treatment, the conductivity of the conductive metal portion can be made high while the transparency of the optically transmissible portion is kept at a high level. The means for setting the gradation to 4.0 or more is, for example, the above-mentioned doping with rhodium ions or iridium ions.

[Oxidation Treatment]

In the producing method of the present invention, a metallic silver portion after the developing treatment is preferably subjected to an oxidation treatment. The oxidation treatment can eliminate a metal slightly deposited in a light transmitting portion, thereby obtaining a transparency of approximately 100% in the light transmitting portion.

As the above-mentioned oxidation treatment, there can be exemplified a known process utilizing various oxidants, such as process with Fe (III) ions. The oxidation treatment can be performed after the exposure and the developing treatment of the layer containing a silver salt.

In the present invention, it is furthermore possible to treat the metallic silver portion after the exposure and the developing treatment, with a Pd-containing solution. Pd can be a divalent palladium ion or metallic Pd. This process can suppress a change of black color in metal silver portion over time.

[Reducing Treatment]

After the developing treatment, the workpiece is immersed into a reducing aqueous solution, whereby a film high in conductivity, which is preferred, can be obtained.

As the reducing aqueous solution, there can be used a sodium sulfite aqueous solution, a hydroquinone aqueous solution, a p-phenylenediamine aqueous solution, an oxalic aqueous solution, or the like. The pH of the aqueous solution is more preferably set to 10 or more.

<Treatment of Smoothing Conductive Metal Portion>
[Smoothing Treatment (Calendering Treatment)]

In the producing method of the present invention, it is preferred to subject the developed metallic silver portion (the entire-surface metallic silver portion, the metallic-mesh patterned portion, or the metallic-wiring patterned portion) to smoothing treatment. By this means, the conductivity of the metallic silver portion increases remarkably. Furthermore, when the area of the metallic silver portion and that of the optically transmissible portion are appropriately designed, yielded is a pinhole-free printed circuit board which has simultaneously both of a high electromagnetic wave shielding property and a high translucency, and which has a black mesh portion having simultaneously both of a translucent electromagnetic wave shielding film and a high conductivity and a high insulation property.

After the formation of the conductive metal portion, it is preferred to subject the workpiece to smoothing treatment in order to increase bonding moieties between the metal particles in the conductive metal portion, It is particularly preferred to conduct the smoothing treatment before the hot water immersion treatment, vapor contacting treatment or hygrothermal treatment, which will be described later. By conducting the hot water immersion treatment, vapor contacting treatment or hygrothermal treatment after the smoothing treatment, the conductive particles can be melted and bonded to each other after united to each other. As a result, the conductivity can be more effectively improved.

The smoothing treatment may be conducted with calendering rolls. The calendering rolls are usually a pair of rolls. The smoothing treatment using the calendering rolls will be referred to as the calendering treatment hereinafter.

The rolls used in the calendering treatment may be each a roll made of a plastic such as epoxy, polyimide, polyamide or polyimideamide, or a roll made of a metal. In particular, in the case where the conductive film has, on both surfaces thereof, emulsion layers, it is preferred that the film is processed by metallic rolls. In the case where the conductive film has, on a single surface thereof, an emulsion layer, a combination of a metallic roll and a plastic roll may be used to prevent creases. The lower limit of the linear pressure is preferably 1,960 N/cm (200 kg/cm) or more, more preferably 2,940 N/cm (300 kg/cm) or more. The upper limit of the linear pressure is preferably 6,860 N/cm (700 kgf/cm) or less. The linear pressure (load) is defined as the force applied per centimeter of a film sample to be compressed.

The temperature applicable to the smoothing treatment, a typical example of which is calender rolling, is preferably from 10° C. (without conducting any temperature-adjustment) to 100° C., and is more preferably from about 10° C. (without conducting any temperature-adjustment) to 50° C. although the more preferred temperature is varied in accordance with the drawn-line density or the shape of the metallic-mesh pattern or the metallic wiring pattern, or the binder species.

As described above, by the producing method of the present invention, a conductive film having a high conductivity can easily be produced at low cost. Preferably, in the present invention, the surface resistance of the conductive film can be sufficiently decreased in the method of using a silver salt (particularly silver halide) photosensitive material to produce the conductive film by conducting smoothing treatment with a high linear pressure of 1,960 N/cm (200 kgf/cm) or more. In the case of conducting the smoothing treatment at such a high linear pressure, it appears that if the metallic silver portion is formed in the form of fine lines (in particular, fine lines having a line width of 25 μm or less), the line width of the metallic silver portion becomes large so that a desired pattern is not easily formed. However, in the case where the object to be subjected to the smoothing treatment is a silver salt photosensitive material (in particular, a silver halide photosensitive material), the enlargement of the line width is small so that a metallic silver portion patterned as desired can be formed. Specifically, a metallic silver portion made of pieces each having a uniform shape can be formed into a desired pattern; therefore, the generation of inferior products can be restrained and the productivity of conductive films can be further improved. When the smoothing treatment is conducted at the above-mentioned linear pressure, the smoothing treatment is preferably conducted with calendering rolls, which are a pair of metallic rolls or a combination of a metallic roll and a resin roll. At this time, the face pressure between the rolls is preferably set to 600 kgf/cm$^2$ or more, more preferably to 800 kgf/cm$^2$ or more, even more preferably to 900 kgf/cm$^2$ or more. The upper limit at this time is set preferably to 2,000 kgf/cm$^2$ or less.

<Vapor Contacting Treatment>

In the preferred first embodiment of the present invention, a conductive metal portion is formed on a support, and then the conductive metal portion is brought into contact with vapor. This enables to improve the conductivity and the transparency easily in a short period. As described above, the reason why the conductivity of the conductive film is improved is not yet clear. In the present invention, however, it appears that at least one part of the binder is removed so that bonding moieties between the metals (conductive materials) particles increase.

The temperature of the vapor brought into contact with the support is preferably 80° C. or higher. The temperature of the vapor is more preferably 100° C. or higher and 140° C. or lower at 1 atom. The period for the contact with the vapor, which is varied in accordance with the kind of the binder to be used, is preferably from about 10 seconds to 5 minutes, more preferably from 1 to 5 minutes in the case where the size of the support is 60 cm×1 m.

<Water Washing Treatment>

In the preferred first embodiment of the present invention, it is preferred that after the conductive metal portion is brought into contact with the vapor, the resultant is washed with water. It seems that the binder dissolved or made brittle by the vapor, by the water washing after the vapor contacting treatment, can be washed away so that the resistivity can be further lowered.

As described above, the preferred first embodiment of the present invention has the vapor contacting step of bringing the conductive metal portion into contact with vapor. In a more preferred embodiment of the present invention, the water washing treatment is conducted after the vapor contacting step. In another more preferred embodiment of the present invention, the vapor contacting treatment is conducted after the smoothing treatment. In an additional more preferred embodiment of the present invention, the smoothing treatment, the vapor contacting step, and the water washing treatment are conducted in this order.

<Hot Water Immersion Treatment>

In the preferred second embodiment of the present invention, a conductive metal portion is formed on a support, and then the conductive metal portion is immersed into hot water of 40° C. or higher. This enables to improve the conductivity and the transparency easily in a short period. As described above, the reason why the conductivity of the conductive film is improved is not yet clear. In the present invention, however, it seems that at least one part of the water-soluble binder is removed so that bonding moieties between metal (conductive material) particles increase.

The temperature of the hot water into which the support is immersed is preferably 40° C. or higher and 100° C. or lower, more preferably from 60 to 100° C., in particular preferably from about 80 to 1010° C. As the temperature is higher, the improvement in the conductivity is more remarkable. The pH of the hot water is preferably from 2 to 13, more preferably from 2 to 9, even more preferably from 2 to 5. The period for the immersion into the hot water of 40° C. or higher or heated water higher than it is varied in accordance with the kind of the water-soluble binder to be used, and is preferably from about 10 seconds to 5 minutes, more preferably from 1 to 5 minutes in the case where the support size is 60 cm×1 m.

As described above, the preferred second embodiment of the present invention has the hot water immersion step of immersing the conductive metal portion into hot water. In a more preferred embodiment of the present invention, the hot water immersion treatment is conducted after the smoothing treatment.

<Hygrothermal Treatment>

In the preferred third embodiment of the present invention, a conductive metal portion is formed on a support, and then the support on which the conductive metal portion is formed is subjected to hygrothermal treatment of allowing the support to stand still in an atmosphere kept under a humidity-adjusted condition that the temperature is 40° C. or higher and the relative humidity is 5% or more. This enables to improve the conductivity and the transparency easily in a short period. As described above, the reason why the conductivity of the conductive film is improved is not yet clear. In the present invention, however, it seems that at least one part of the water-soluble binder becomes easy to shift microscopically as the humidity becomes higher so that bonding moieties between metal (conductive material) particles increase.

As for the temperature of the humidity-adjusted condition, it is preferably 40° C. or higher and 100° C. or lower, more preferably from 60 to 100° C., in particular preferably from about 80 to 100° C. As the temperature is higher, the improvement in the conductivity is more remarkable. As for the relative humidity of the humidity-adjusted condition, it is preferably from 5 to 100%, more preferably from 40 to 100%, even more preferably from 60 to 100%, in particular preferably from 80 to 100%. The period for the hygrothermal treatment, which is varied in accordance with the kind of the water-soluble binder to be used, is preferably from about 5 to 60 minutes, more preferably from about 5 to 30 minutes, in particular preferably from about 5 to 10 minutes in the case where the support size is 60 cm×1 m.

As described above, the preferred third embodiment of the present invention has the hygrothermal treatment step of allowing the support on which the conductive metal portion is formed to stand still in an atmosphere kept under a humidity-adjusted condition that the temperature is 40° C. or higher and the relative humidity is 5% or more. In a more preferred embodiment of the present invention, the hygrothermal treatment is conducted after the smoothing treatment.

In the producing method of the present invention, a mesh-form metallic silver portion wherein the line width, the aperture rate, and the Ag content are specified is formed directly onto a support by exposing and developing treatments; thus, the resultant has a sufficient surface resistance value. It is therefore unnecessary that the metallic silver portion is further subjected to physical development and/or plating treatment, thereby giving conductivity newly thereto. For this reason, a translucent electromagnetic wave shielding film can be produced through simple processes.

[Plating Treatment]

In the present invention, the conductive metal portion may be subjected to plating treatment. The plating treatment enables to make the surface resistance lower and make the conductivity higher. The plating treatment may be electroplating or electroless plating. The material which constitutes the plating layer is preferably a metal having a sufficient conductivity. Copper is preferred.

A combination of the present invention with any one of techniques disclosed in the following publications may be used as far as the combination does not depart from the subject matter of the present invention: JP-A-2004-221564, JP-A-2004-221565, JP-A-2006-012935, JP-A-2006-010795, JP-A-2006-228469, JP-A-2006-228473, JP-A-2006-228478, JP-A-2006-228480, JP-A-2006-228836, JP-A-2006-267627, JP-A-2006-269795, JP-A-2006-267635, JP-A-2006-286410, JP-A-2006-283133, and JP-A-2006-283137.

The conductive film produced by the method of the present invention, which has a low resistance, may be used as an electromagnetic wave shielding material. In particular, the conductive film which has translucency can be preferably used as a translucent electromagnetic wave shielding film, a transparent heat-generating film or the like. The conductive film of the present invention may widely be applied to a liquid crystal display, a plasma display panel, an organic EL, an inorganic EL, a solar cell, a touch panel, a printed circuit board, or others. Thus, a plasma display panel formed by use of a translucent electromagnetic wave shielding film, for plasma display panel, containing the translucent electromagnetic wave shielding film of the present invention is high in electromagnetic wave shielding ability, contrast and brightness, and can be produced at low cost.

The following is an explanation of a preferred embodiment of an electromagnetic wave shielding film wherein a conductive film of the present invention is used. FIG. 1 is a sectional view of the preferred embodiment of the electromagnetic wave shielding film, wherein a conductive film of the present invention is used.

An electromagnetic wave shielding film 10 has a transparent support 12; and a fine line structural portion (conductive metal portion) 14 made of a conductive metal and a translucent conductive film 16, each of which is arranged on the support 12. The fine line structural portion 14 corresponds to the above-mentioned conductive metal portion, and the support 12 and the fine line structural portion 14 in FIG. 1 correspond to the conductive film of the present invention. In other words, the electromagnetic wave shielding film 10 illustrated in FIG. 1 is a product wherein a conductive film of the present invention is combined with the translucent conductive film 16. The electromagnetic wave shielding film 10 can be produced by forming a conductive film of the present invention and a transparent film wherein the translucent conductive film 16 is formed separately and then putting the films onto each other. As illustrated in FIG. 1, the thickness (height) of the fine line structural portion 14 may be made substantially equal to the thickness (height) of the translucent conductive film 16, thereby making the upper surface of the fine line structural portion 14 naked. In order to improve the adhesive property between the translucent conductive film 16 and the conductive film of the present invention, and or some other property, it is preferred to use an intermediate layer made of an organic polymeric material or to conduct surface treatment.

[Translucent Conductive Film 16]

The translucent conductive film 16 is obtained by causing any one of the following materials to adhere evenly, by coating, printing or the like, onto a transparent film such as polyethylene terephthalate or polyethylene naphthalate base: a transparent conductive organic polymer such as PEDOT (polyethylene dioxythiophene)/PSS, polyaniline, polypyrrole, polythiophene, or polyisothianaphthene, a metal oxide, metal fine particles, a conductive metal such as a metal nanorod or nano-wire, conductive inorganic particles such as carbon nanotubes, or an organic water-soluble salt. These coating solutions may be used by blending other non-conductive polymer, latex or the like in order to improve the coatability, or adjust the film physical property. A multi-layered structure wherein a silver thin film is sandwiched between high-refractive index layers may be used. These transparent conductive materials are described in "The Present Situation and Future of Electromagnetic Wave Shielding Materials", published by Toray Research Center, Inc., JP-A-9-147639, and others. The manner for the coating and the printing may be a coating coater such as a slide coater, a slot die coater, a curtain coater, a roll coater, a bar coater or a gravure coater, screen printing, or the like.

The volume resistance of the conductive film 16 is preferably 0.05 Ωcm or more. Further, the surface resistance of the conductive film 16 is preferably 1000 Ω/sq or more. The surface resistance of the conductive film 16 may be measured in accordance with the measuring method described in JIS K6911.

The conductive film 16 is preferably crosslinked since the water resistance, the solvent resistance, and other properties thereof are improved. In this case, the conductive film 16 may be crosslinked with a crosslinking agent, or may be crosslinked, without adding any crosslinking agent, only by use of a photochemical reaction induced by irradiation with light through a means which does not produce any effect onto the photosensitivity. Examples of the crosslinking agent include vinylsulfones (such as 1,3-bisvinylsulfonylpropane), aldehydes (such as glyoxal), pyrimidine chlorides (such as 2,4,6-trichloropyrimidine), triazine chlorides (such as cyanuric chloride), epoxy compounds, and carbodiimide compounds.

Preferred examples of the epoxy compounds include 1,4-bis(2',3'-epoxypropyloxy)butane, 1,3,5-triglycidyl isocyanurate, 1,3-diglycidyl-5-(Υ-acetoxy-β-oxypropyl) isocyanurate, sorbitol polyglycidyl ethers, polyglycerol polyglycidyl ethers, pentaerythritol polyglycidyl ethers, diglycerol polyglycidyl ethers, 1,3,5-triglycidyl(2-hydroxyethyl) isocyanurate, glycerol polyglycerol ethers, and trimethylolpropane polyglycidyl ethers. Specific examples of commercially available products thereof include DENACOL EX-521 and DENACOL EX-614B (trade names, manufactured by Nagase Chemicals, Ltd.). However, the epoxy compounds are not limited thereto.

As the carbodiimide compounds, a compound having in the molecule plural carbodiimide structures is preferably used. Poly carbodiimides are usually synthesized by a condensation reaction of organic diisocyanates. The organic group(s) of the organic diisocyanate used to synthesize the compound having in the molecule thereof carbodiimide structures is/are not particularly limited, and may be of an aromatic type, of an aliphatic type, or of a mixed type thereof. From the viewpoint of reactivity, the aliphatic type is in particular preferably. Examples of a raw material include organic isocyanates, organic diisocyanates, organic triisocyanates and the like. Examples of the organic isocyanates include aromatic isocyanates, aliphatic isocyanates, and mixtures thereof. Specific examples of the organic isocyanates include 4,4'-diphenylmethane diisocyanate, 4,4-diphenyldimethylmethane diisocyanate, 1,4-phenylene diisocyanate, 2,4-tolylene diisocyanate, 2,6-tolylene diisocyanate, hexamethylene diisocyanate, cyclohexane diisocyanate, xylylene diisocyanate, 2,2,4-trimethylhexamethylene diisocyanate, 4,4'-dicyclohexylmethane di isocyanate, 1,3-phenylene diisocyanate and the like. Further, specific examples of the organic monoisocyanates include isophorone isocyanate, phenyl isocyanate, cyclohexyl isocyanate, buthyl isocyanate, naphthyl isocyanate and the like. As the specific commercial product of carbodiimide series compounds, CARBODILITE V-02-L2 (trade name, manufactured by Nisshinbo Industries, Inc.) and the like are available.

As the forming method of the conductive film 16, there can be utilized various physical methods such as sputtering, and various well-known coating methods such as dip coating, air knife coating, curtain coating, wire bar coating, gravure coating, and extrusion coating.

In the case of forming the conductive film 16 by these methods, the following methods are preferably used: (A) a method of embedding concaves in the fine line pattern to adjust the amount of the laid conductive film 16 in such a method the surface of the fine line structural portion 14 and the surface of the conductive film 16 can form, for example, a flat and smooth surface; (B) a method of adjusting in such a manner that the surface of the fine line structural portion 14 and the surface of the conductive film 16 can form a flat and smooth surface by polishing, and (C) a method of subjecting the surface of the fine line structural portion 14 to surface treatment for preventing the material of the conductive film 16 from adhering onto the surface, and then forming the conductive film 16.

In the method (C), the surface of the fine line structural portion 14 is desirably low in polarity or hydrophobic since the coating solution of the material of the conductive film 16 is generally high in polarity or hydrophilic. Specifically, it is preferred to subject the surface of the fine line structural portion 14 to surface treatment with a hydrophobic metal surface treating agent, typical examples of which include alkylthiols. This treating agent is more preferably removed by post-treatment.

Further, the conductive film 16 may be separately provided with a functional layer having functionality according to need. Such functional layer may have different specifications according to each application. For example, there may be provided with an anti-reflective layer with an anti-reflective function by adjusting a refractive index or a film thickness; a non-glare layer or an anti-glare layer (both having an anti-glare function); a near infrared-absorbing layer formed of a compound or a metal absorbing a near infrared light; a layer having a color adjusting function for absorbing a visible light of a specified wavelength region; an anti-stain layer enabling easy removal of a stain such as finger prints; a hard coat layer not easily scratched; a layer having an impact absorbing function; or a layer capable of avoiding glass scattering in case of a glass breakage.

According to the present invention, a conductive film having a high conductivity can be produced at low cost without conducting any plating treatment. Moreover, when its conductive metal portion is a predetermined patterned form, the conductive film has a high transparency besides the high conductivity. In particular, a translucent conductive film having a high electromagnetic wave shielding property and a high transparency, and including black meshes (a black mesh portion) can be produced at low cost by use of a silver salt photosensitive material.

The conductive film produced by the method of the present invention is low in resistance, and can be used as an electromagnetic wave shielding material. In particular, the conductive film which has translucency is useful as a translucent electromagnetic wave shielding film, a transparent heat-generating film or the like. The conductive film of the present invention may be applied to a liquid crystal television, a plasma television, an organic EL, an inorganic EL, a solar cell, a touch panel, and others, Additionally, the conductive film may widely be applied, as a conductive patterning material, to a printed circuit board or others.

EXAMPLES

The present invention will be explained further specifically using examples below. In the following examples, a material, an amount of use, a proportion, a content of processing and a processing procedure may be suitably varied as far as they do not depart from the subject matter of the present invention. Therefore the scope of the present invention should not be construed restrictively by such examples.

Example 1-1

(Preparation of Emulsion A)

To the following solution 1, while the temperature and the pH of which were kept at 38° C. and 4.5, respectively, the following solutions 2 and 3 (amounts corresponding to 90% of the respective solution amounts) were added simultaneously over a period of 20 minutes with being stirred. In this way, nucleus particles 0.16 μm in size were formed. Subsequently, the following solutions 4 and 5 were added thereto over a period of 8 minutes, and the rests of the solutions 2 and 3 (amounts corresponding to 10% of the respective solution amounts) were further added thereto over a period of 2 minutes so as to cause the particles to grow up to 0.21 μm in size. Furthermore, 0.15 g of potassium iodide was added thereto, and the resultant was aged for 5 minutes to end the formation of the particles.

Solution 1:

| Water | 750 ml |
|---|---|
| Gelatin (phthalation-treated gelatin) | 20 g |
| Sodium chloride | 3 g |
| 1,3-Dimethylimidazolidine-2-thione | 20 mg |
| Sodium benzenethiosulfonate | 10 mg |
| Citric acid | 0.7 g |

Solution 2:

| Water | 300 ml |
|---|---|
| Silver nitrate | 150 g |

Solution 3:

| Water | 300 ml |
|---|---|
| Sodium chloride | 38 g |
| Potassium bromide | 32 g |

-continued

| Potassium hexachloroiridate (III) (0.005% in 20% aqueous KCl solution) | 5 ml |
|---|---|
| Ammonium hexachlororhodate (0.001% in 20% aqueous NaCl solution) | 7 ml |

The potassium hexachloroiridate (III) (0.005% in 20% aqueous KCl solution) and ammonium hexachlororhodate (0.001% in 20% aqueous NaCl solution) used in Solution 3 were prepared by dissolving powders thereof in a 20% aqueous solution of KCl and a 20% aqueous solution of NaCl respectively and heating the solutions at 40° C. for 120 minutes.

Solution 4:

| Water | 100 ml |
|---|---|
| Silver nitrate | 50 g |

Solution 5:

| Water | 100 ml |
|---|---|
| Sodium chloride | 13 g |
| Potassium bromide | 11 g |
| Potassium ferrocyanide | 5 mg |

Thereafter, washing with water by the flocculation method according to the ordinary method was conducted. Specifically, the temperature was lowered to 35° C., and the pH was lowered using sulfuric acid until the silver halide precipitated (the pH was in the range of 3.2±0.2). About 3 L of the supernatant was then removed (first water washing). Further, 3 L of distilled water was added to the mixture, and sulfuric acid was added until silver halide precipitated. 3 L of the supernatant was again removed (second water washing). The procedure same as the second water washing was repeated once more (third water washing), and water-washing and desalting steps were thus completed. The emulsion after the water-washing and desalting was adjusted to the pH of 6.4 and the pAg of 7.5. Thereto, 10 mg of sodium benzenethiosulfonate, 3 mg of sodium benzenethiosulfinate, 15 mg of sodium thiosulfate, and 10 mg of chloroauric acid were added, and the mixture was thus subjected to chemical sensitization to obtain the optimal sensitivity at 55° C. Then, 100 mg of 1,3,3a,7-tetrazaindene as a stabilizing agent, and 100 mg of Proxel (trade name, manufactured by ICI Co., Ltd.) as an antiseptic were added. Finally, a silver iodochlorobromide cubic particle emulsion containing 70 mol % of silver chloride and 0.08 mol % of silver iodide and having an average particle diameter of 0.22 μm and a coefficient of variation of 9% was obtained. The emulsion had finally a pH of 6.4, a pAg of 7.5, an electrical conductivity of 40 μS/m, a density of $1.2 \times 10^{-3}$ kg/m$^3$, and a viscosity of 60 mPa·s.

(Preparation of Coating Sample)

<<Preparation of Emulsion Layer Coating Solution-1>>

To the above-described Emulsion A, $5.7 \times 10^{-4}$ mol/mol Ag of a sensitizing dye (SD-1) was added so as to carry out spectral sensitization. Furthermore, $3.4 \times 10^{-4}$ mol/mol Ag of KBr and $8.0 \times 10^{-4}$ mol/mol Ag of Compound (Cpd-1) were added thereto and mixed well.

Subsequently, $1.2 \times 10^{-4}$ mol/mol Ag of 1,3,3a,7-tetrazaindene, $1.2 \times 10^{-2}$ mol/mol Ag of hydroquinone, $3.0 \times 10^{-4}$ mol/mol Ag of citric acid, 90 mg/m² of sodium 2,4-dichloro-6-hydroxy-1,3,5-triazine, 15% by mass relative to the gelatin of colloidal silica having a particle size of 10 μm, 50 mg/m² of aqueous latex (aqL-6), 100 Mg/m² of a polyethylacrylate latex, 100 mg/m² of a latex copolymer of methyl acrylate, sodium 2-acrylamide-2-methylpropanesulfonate, and 2-acetoxyethyl methacrylate (ratio by mass 88:5:7), 100 mg/m² of a core-shell type latex (core: styrene/butadiene copolymer (ratio by mass 37/63), shell: styrene/2-acetoxyethyl acrylate (ratio by mass 84/16), core/shell ratio=50/50), and a film-curing agent (Cpd-7) (4% by mass of relative to the gelatin) were added to the mixture, and the pH of the coating solution so obtained was adjusted to 5.6 using citric acid, to prepare an emulsion layer coating solution-1.

<<Emulsion Layer Coating Solution-2>>

Emulsion layer coating solution-2 was prepared in the same way as in the preparation of the emulsion layer coating solution-1 except that the film-curing agent (Cpd-7) was not added.

To the thus-prepared emulsion layer coating solution-1 or 2 was added carrageenan, which was a water-soluble binder, in an amount of 0.19 g/m² with respect to Ag. This was coated onto a polyethylene terephthalate (PET) support to set the amount of Ag and that of the binder to 10.5 g/m² and 0.525 g/m², respectively. Thereafter, the resultant was dried. The PET was subjected to hydrophilicity-imparting treatment in advance.

In each of the resultant coating samples, the ratio by volume of Ag to the binder in the emulsion layer was 4/1. The sample corresponds to the ratio of Ag to the binder is ¼ or more, which is preferably used for photosensitive material for forming the conductive film of the present invention.

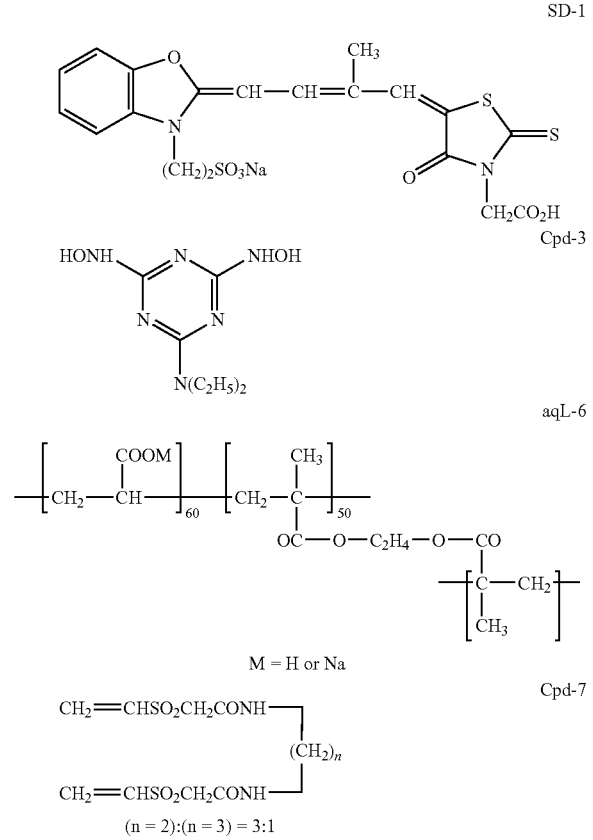

(Exposure/Developing Treatment)

Next, samples were made by coating and drying with the use of the above-mentioned emulsion layer coating solution-2. The resultant samples were each exposed to parallel light from a high-pressure mercury lamp as a light source through a lattice-form photomask capable of giving a developed silver image wherein lines and spaces were 10 μm and 290 μm, respectively (a photomask wherein lines and spaces were 290 μm and 10 μm (pitch: 300 μm), respectively, and the spaces were in a lattice form). The resultant was developed with the following developing solution, subjected further to developing treatment by use of a fixing solution (trade name: N3X-R for CN16X, manufactured by Fuji Photo Film Co., Ltd.), and rinsed with pure water. In this way, samples were obtained.

[Composition of Developing Solution]

1 liter of the developing solution contains the following compounds:

| | |
|---|---|
| Hydroquinone | 0.037 mol/L |
| N-Methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Calendering Treatment+Vapor Contacting Treatment)

The samples, subjected to the developing and fixing treatments as described above, were subjected to a calendering treatment. The calendering rolls were metallic rolls, and the samples were passed through the space between the rollers at an applied linear pressure of 4900 N/cm (500 kg/cm). The surface resistance of the processed samples was measured. Thereafter, the surfaces of some of the samples were brought into contact with water vapor 100° C. in temperature.

Out of the resultant samples, one subjected only to the calendering treatment was named sample 1101, one subjected to the calendering treatment followed by the contact with water vapor 100° C. in temperature for 1 minute was named sample 1102, and one subjected to the calendering treatment followed by the contact with water vapor 100° C. in temperature for 5 minutes was named sample 1103.

(Evaluation)

The surface resistance of each of the formed samples 1101 to 1103 was measured with a series 4-explorer probe (ASP) (trade name: ROLESTER GP, model number: MCP-T610, manufactured by Dia Instruments Co., Ltd.). An "aperture rate" means a ratio of a portion having no fine lines constituting the mesh to the entire area, and, for example, a square lattice mesh of a line width of 10 μm and a pitch of 200 μm has an aperture rate of 90%. The results are shown in Table 1 below.

TABLE 1

| Sample | Surface resistance before vapor contacting treatment | Period for vapor treatment | Surface resistance after vapor treatment | Aperture rate | Remarks |
|---|---|---|---|---|---|
| 1101 | 1.4 Ω/□ | — | — | 89% | Comparative example |
| 1102 | 1.4 Ω/□ | 1 minute | 0.86 Ω/□ | 88% | Example of this invention |
| 1103 | 1.4 Ω/□ | 5 minutes | 0.85 Ω/□ | 88% | Example of this invention |

As is evident from the results in Table 1, samples 1101 to 1103 each had an aperture rate of 88 to 89%, and each had a high transparency. However, sample 1101 (Comparative Example), wherein only the calendering treatment was conducted after the development, had a surface resistance of 1.4 Ω/sq. On the other hand, in samples 1102 and 1103 (the present invention examples), wherein the vapor contacting treatment was conducted besides the calendering treatment, the surface resistance was lower compared with sample 1101. Thus, it is shown that samples 1102 and 1103 had a higher conductivity. Therefore, it is shown that the conductive film of the present invention simultaneously has a high conductivity and a high translucency.

Example 1-2

Samples prepared and subjected to exposing and developing treatments in the same way as in Example 1-1 were each subjected to a calendering treatment and a vapor contacting treatment. The calendering treatment was conducted in the same way as in Example 1-1 except that the load was changed.

Out of the resultant samples, one subjected to no calendering treatment and brought into contact with vapor for 30 seconds was named sample 1201; ones subjected to the calendering treatment with loads of 1,960 N/cm (200 kgf/cm), 2,940 N/cm (300 kgf/cm), 3,920 N/cm (400 kgf/cm), 5,880 N/cm (600 kgf/cm) and 6,860 N/cm (700 kgf/cm), respectively, and then brought into contact with vapor for 30 seconds were named sample 1202 to 1206, respectively; and ones brought into contact with vapor for 30 seconds and then subjected to the calendering treatment with loads of 1,960 N/cm (200 kgf/cm), 2,940 N/cm (300 kgf/cm), 3,920 N/cm (400 kgf/cm), 5,880 N/cm (600 kgf/cm) and 6,860 N/cm (700 kgf/cm), respectively, were named samples 1207 to 1211, respectively.

With respect to each of the samples, the surface resistance thereof was measured in the same way as in Example 1-1 before the vapor contacting treatment. The results are shown in Table 2 below, (Evaluation)

With respect to each of the formed samples 1201 to 1211, the surface resistance thereof was measured in the same way as in Example 1-1. Additionally, a digital microscope (trade name: VH-6200, manufactured by Keyence Corp.) was used to measure the width of lines of the lattice pattern from the distance between two points therein.

The results are shown in Table 2.

TABLE 2

| Sample | Load of calendar (kgf/cm) | Surface resistance before vapor treatment (Ω/sq) | Period for contact with vapor | Surface resistance after the whole treatments (Ω/sq) | Line width (μm) |
|---|---|---|---|---|---|
| 1201 | 0 | 2.32 | 30 seconds | 1.378 | 17 |
| 1202 | 200 | 1.317 | 30 seconds | 0.8 | 17.2 |
| 1203 | 300 | 1.314 | 30 seconds | 0.797 | 16.8 |
| 1204 | 400 | 1.322 | 30 seconds | 0.787 | 16.9 |
| 1205 | 600 | 1.31 | 30 seconds | 0.81 | 17.4 |
| 1206 | 700 | 1.32 | 30 seconds | 0.82 | 17.2 |

TABLE 2-continued

| Sample | Load of calendar (kgf/cm) | Surface resistance before vapor treatment (Ω/sq) | Period for contact with vapor | Surface resistance after the whole treatments (Ω/sq) | Line width (μm) |
|---|---|---|---|---|---|
| 1207 | 200 | 2.32 | 30 seconds | 1.1 | 17.2 |
| 1208 | 300 | 2.35 | 30 seconds | 1.15 | 17.4 |
| 1209 | 400 | 2.3 | 30 seconds | 1.2 | 17.6 |
| 1210 | 600 | 2.34 | 30 seconds | 1.1 | 17.8 |
| 1211 | 700 | 2.21 | 30 seconds | 1.16 | 17.2 |

As is evident from the results in Table 2, it is shown that the resistance of samples 1202 to 1206, after the entire processing, which were each subjected to the calendering treatment and then brought into contact with the vapor, is able to be made smaller than the resistance of sample 1201, which was subjected to the vapor contacting treatment without being subjected to any calendering treatment, and samples 1207 to 1211, which were each brought into contact with the vapor and then subjected to the calendering treatment. For this reason, it is shown that a high conductivity is more effectively obtained by conducting such a calendering treatment in advance followed by conducting such a vapor contacting treatment.

Figure 2:
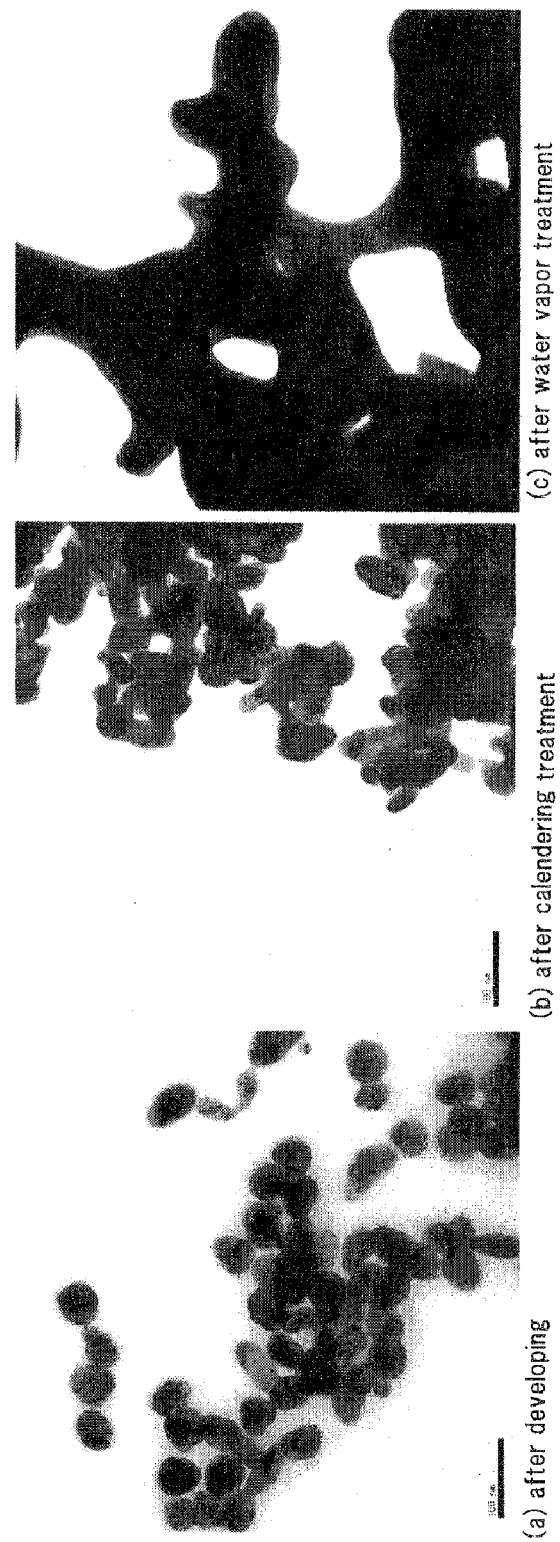
FIG. 2 are photographs showing states of silver particles in a conductive metal portion before and after it is put into a vapor bath.

With the above-mentioned sample 1204, a digital TEM (transmission electron microscope) was used to observe the state of its conductive metal portion after the development, after the calendering treatment and after the vapor contacting treatment, respectively. The results are shown in FIG. 2. As is evident from FIG. 2, the following is shown: silver particles are present in a scattered sate after the development (FIG. 2(a)); the silver particles are bonded to each other after the calendering treatment (FIG. 2(b); and the silver particles were melted and bonded to each other after the vapor contacting treatment (FIG. 2(c)). Also for this reason, it is understood that a high conductivity is more effectively obtained by conducting such a calendering treatment in advance followed by conducting such a vapor contacting treatment.

Example 1-3

Samples prepared and subjected to exposing and developing treatments and calendering treatment in the same way as in Example 1-1 were each subjected to a vapor contacting treatment as follows: the vapor contacting treatment was conducted in the same way as in Example 1-1 except that the vapor temperature was changed.

Out of the resultant samples, one treated at 80° C. was named sample 1301, one treated at 90° C. was named sample 1302, one treated at 100° C. was named sample 1303, one treated at 110° C. was named sample 1304, one treated at 120° C. was named sample 1305, and one treated at 130° C. was named sample 1306.

With respect to each of the samples, the surface resistance thereof was measured in the same way as in Example 1-1 before and after the vapor contacting treatment. The width of lines of the lattice pattern was measured in the same way as in Example 1-2. The results are shown in Table 3 below.

TABLE 3

| Sample | Temperature of vapor (° C.) | Surface resistance before vapor treatment (Ω/sq) | Period for contact with vapor | Surface resistance after vapor treatment (Ω/sq) | Line width (μm) |
|---|---|---|---|---|---|
| 1301 | 80 | 1.32 | 30 seconds | 0.79 | 17 |
| 1302 | 90 | 1.317 | 30 seconds | 0.8 | 17.2 |
| 1303 | 100 | 1.314 | 30 seconds | 0.797 | 16.8 |
| 1304 | 110 | 1.322 | 30 seconds | 0.787 | 16.9 |
| 1305 | 120 | 1.31 | 30 seconds | 0.81 | 17.4 |
| 1306 | 130 | 1.32 | 30 seconds | 0.78 | 17.2 |

As is evident from the results in Table 3, it is shown that the conductive becomes high, according to the method of the present invention, even if the vapor temperature is changed.

Example 1-4

(Preparation of Emulsion B)

Emulsion B was prepared in the same way as in the preparation of the Emulsion A in Example 1-1 except that the amount of gelatin in the solution 1 was changed to 8 g.

(Formation of a Coating Sample B)

The above-mentioned Emulsion B was used to prepare an emulsion coating solution in the same way as in the emulsion layer coating solution-1 in Example 1-1. To the prepared emulsion coating solution was added carrageenan, which was a water-soluble binder, in an amount of 0.19 g/m² with respect to Ag.

The thus-prepared emulsion layer coating solution was coated onto a polyethylene terephthalate (PET) support to set the amount of Ag and that of gelatin to 4.0 g/m² and 0.221 g/m², respectively. Thereafter, the resultant was dried, The resultant was named coating sample B. The PET was subjected to hydrophilicity-imparting treatment in advance. In the resultant coating sample, the ratio by volume of Ag to the binder in the emulsion layer was 2.3/1. The sample corresponds to the ratio of Ag to the binder is 1/1 or more, which is preferably used for photosensitive material for forming the conductive film of the present invention. Additionally, a protective layer was formed on the emulsion layer. The constituents of the protective layer were as follows:

| | |
|---|---|
| Gelatin | 0.135 g/m² |
| Water | 8.21 g/m² |
| Surfactant | 0.015 g/m² |
| Antiseptics | 0.003 g/m² |

The protective layer was formed in a coating method well-known for a layer on an emulsion layer. The film thickness of the protective layer after the layer was dried was 0.15 Mm.

(Preparation of Samples 1401 to 1424)

The blended amount of the film-curing agent (Cpd-7) in the coating sample B was changed so as to vary the ratio by mass of the binder to the film-curing agent as shown in Table 4 below. In this way, samples were prepared. Out of the resultant samples, samples 1401 to 1406 were samples into which the film-curing agent was not incorporated; samples 1407 to 1412 were samples wherein the ratio by mass of the binder to the film-curing agent was 22/1; samples 1413 to 1418 were samples wherein the ratio by mass of the binder to the film-curing agent was 16/1; and samples 1419 to 1424 were samples wherein the ratio by mass of the binder to the film-curing agent was 11/1.

(Exposing/Developing Treatments)

With respect to each of the samples, an entire surface thereof was exposed to parallel light from a high-pressure mercury lamp as a light source without using any photomask. The resultant was then developed in the same way as in Example 1-1.

(Calendering Treatment+Vapor Contacting Treatment)

Each of the samples was subjected to a calendering treatment with a calendering load of 3,920 N/cm (400 kgf/cm), and then subjected to a vapor contacting treatment. The calendering treatment was conducted in the same way as in Example 1-1 except that the load was changed. In the individual vapor contacting treatment with respect to the samples, the vapor contacting period was changed to 15 seconds, 30 seconds, 45 seconds, 1 minute, 2 minutes and 3 minutes, respectively.

With respect to each of the samples, the surface resistance thereof was measured in the same way as in Example 1-1 after the calendering treatment and after the vapor contacting treatment. The results are shown in Table 4.

TABLE 4

| Sample | Binder/Film-curing agent ratio | Resistance before calendering treatment (Ω/sq) | Period for contact with vapor | Resistance after vapor treatment (Ω/sq) |
|---|---|---|---|---|
| 1401 | 0 | 1.87 | 15 seconds | 0.9 |
| 1402 | 0 | 2.1 | 30 seconds | 1.11 |
| 1403 | 0 | 2.01 | 45 seconds | 1.06 |
| 1404 | 0 | 2.14 | 1 minute | 1.16 |
| 1405 | 0 | 1.89 | 2 minutes | 0.95 |
| 1406 | 0 | 1.78 | 3 minutes | 0.86 |
| 1407 | 22/1 | 6.7 | 15 seconds | 2.85 |
| 1408 | 22/1 | 5.47 | 30 seconds | 2.81 |
| 1409 | 22/1 | 7.08 | 45 seconds | 3.99 |
| 1410 | 22/1 | 7.83 | 1 minute | 3.04 |
| 1411 | 22/1 | 7.95 | 2 minutes | 3.2 |
| 1412 | 22/1 | 6.47 | 3 minutes | 3.01 |
| 1413 | 16/1 | 24.5 | 15 seconds | 13.23 |
| 1414 | 16/1 | 25.17 | 30 seconds | 17.92 |
| 1415 | 16/1 | 26.12 | 45 seconds | 13.73 |
| 1416 | 16/1 | 24.63 | 1 minute | 12.93 |
| 1417 | 16/1 | 20.32 | 2 minutes | 10.87 |
| 1418 | 16/1 | 21.81 | 3 minutes | 12.22 |
| 1419 | 11/1 | 48.55 | 15 seconds | 33.88 |
| 1420 | 11/1 | 48.92 | 30 seconds | 32.14 |
| 1421 | 11/1 | 43.97 | 45 seconds | 33.03 |
| 1422 | 11/1 | 45.75 | 1 minute | 35.78 |
| 1423 | 11/1 | 48.08 | 2 minutes | 31.71 |
| 1424 | 11/1 | 41.66 | 3 minutes | 32.94 |

As is evident from the results in Table 4, it is shown that the surface resistance is lowered and the conductivity is raised, even in samples containing a film-curing agent, as the result of conducting vapor treatment. For this reason, the following are understood: the conductivity can be improved according to the present invention; and it is preferred not to use any film-curing agent in order to make the surface resistance lower. The samples containing a film-curing agent have a larger surface resistance value than samples containing no film-curing agent. However, the value is at such a level that no practical problem is caused.

Example 1-5

Coating samples were prepared in the same way as in Example 1-1. At this time, the amount of gelatin in the emulsion layer coating solution was changed to vary the ratio by volume of Ag to the binder in the emulsion layer to 4.0/1, 3.1/1, 2.5/1, 2.1/1, 1.3/1, 1.1/1, and 1.0/1, respectively, and the amount of Ag therein was set to 10.5 g/m². The formed samples were named samples 1501 to 1507, respectively. Additionally, a protective layer was formed on each of their emulsion layers in the same way as in Example 1-4.

Each of the samples was subjected to exposing and developing treatments in the same way as in Example 1-1, and then put into a vapor atmosphere for 1 minute while a calendering load of 3,920 N/cm (400 kgf/cm) was applied thereto.

With respect to each of the samples, the surface resistance thereof was measured in the same way as in Example 1-1 after the calendering treatment and after the vapor contacting treatment. The width of lines of the lattice pattern was measured in the same way as in Example 1-2. The results are shown in fable 5.

TABLE 5

| Sample | Ag/Binder ratio | Resistance before calendering treatment (Ω/sq) | Period for contact with vapor | Resistance after calendaring process (Ω/sq) | line width (μm) |
|---|---|---|---|---|---|
| 1501 | 4 | 0.91 | 1 minute | 0.75 | 19 |
| 1502 | 3.1 | 1.35 | 1 minute | 0.81 | 18.2 |
| 1503 | 2.5 | 1.52 | 1 minute | 0.92 | 18.3 |
| 1504 | 2.1 | 2.1 | 1 minute | 1.15 | 18.5 |
| 1505 | 1.3 | 4.33 | 1 minute | 1.63 | 18.1 |
| 1506 | 1.1 | 6.02 | 1 minute | 2.49 | 18.2 |
| 1507 | 1 | 10.12 | 1 minute | 4.21 | 18.6 |

As is evident from the results in Table 5, it is shown that the conductivity becomes high, according to the present invention, even when the conductive film is brought into contact with vapor under the condition the ratio of Ag to the binder is varied from 4/1 to 1/1 respectively.

Example 1-6

A conductive paste (trade name: PELTRON K-3424LB, manufactured by Pelnox, Ltd.; silver/epoxy resin; silver particle diameter: about 7 to 8 μm) was used and painted onto polyethylene terephthalate (PET) supports, and then dried to form coating samples (samples 1601 to 1604). Each of the PETs was subjected to hydrophilicity-imparting treatment in advance. At this time, samples 1601 and 1602 were dried on the curing conditions of 120° C. for 30 minutes. Samples 1603 and 1604 were allowed to stand still for 10 minutes to be naturally dried. Thereafter, samples 1602 and 1604 were each subjected to a calendering treatment in the same way as in Example 1-1 with a calendering load of 3,920 N/cm (400 kg/cm). Samples 1601 and 1603 were subjected to no calendering treatment.

Next, each of the samples was brought into contact with vapor of 90° C. for 3 minutes.

With respect to each of the samples, the surface resistance thereof was measured in the same way as in Example 1-1 after the drying, after the calendering treatment and after the vapor contacting treatment. The results are shown in Table 6.

TABLE 6

| Sample | Drying | Resistance after coating (Ω/sq) | Resistance after calendering treatment (Ω/sq) | Period for contact with vapor | Resistance after vapor contacting treatment (Ω/sq) |
|---|---|---|---|---|---|
| 1601 | 120° C. 30 minutes | 0.02 | — | 3 minutes | 0.014 |
| 1602 | 120° C. 30 minutes | 0.02 | 0.022 | 3 minutes | 0.01 |
| 1603 | naturally | 0.2672 | — | 3 minutes | 0.027 |
| 1604 | naturally | 0.281 | 0.301 | 3 minutes | 0.02 |

As is evident from the results in Table 6, in the case of using the silver nano-paste, a conductive film can be formed in a short time by conducting drying process instead of exposing and developing treatments for silver salt photosensitive material, The resistance of samples 1601 and 1602, which were dried at 120° C., was able to be more effectively lowered compared with the resistance of samples 1603 and 1604, which were naturally dried. Furthermore, the resistance of samples 1602 and 1604, wherein the calendering treatment was conducted, was able to be more effectively lowered compared with the resistance of samples 1601 and 1603, wherein no calendering treatment was conducted.

Example 2-1

Samples were prepared, and then subjected to exposing and developing treatments followed by a calendering treatment, and then the surface resistances of the resultants were measured after the calendering treatment in the same way as in Example 1-1. Thereafter, the samples were immersed into hot water of 90° C.

Out of the resultant samples, one subjected only to the calendering treatment was named sample 2101; one subjected to the calendering treatment and then immersed in the hot water of 90° C. for 1 minute was named samples 2102; one immersed for 5 minutes was named samples 2103; and one immersed for 10 minutes was named samples 2104, respectively.

(Evaluation)

The surface resistance of each of the samples was measured in the same way as in Example 1-1. The results are shown in Table 7 below,

TABLE 7

| Sample | Surface Resistance before hot water treatment | Period for hot water treatment | Surface Resistance after hot water treatment | Aperture rate | Remarks |
|---|---|---|---|---|---|
| 2101 | 1.4 Ω/□ | — | — | 89% | Comparative example |
| 2102 | 1.4 Ω/□ | 1 minute | 1.1 Ω/□ | 88% | This invention |
| 2103 | 1.4 Ω/□ | 5 minutes | 0.84 Ω/□ | 89% | This invention |
| 2104 | 1.4 Ω/□ | 10 minutes | 0.85 Ω/□ | 89% | This invention |

As is evident from the results in Table 7, samples 2101 and 2104 each had an aperture rate of 88 to 89%, and each had a high transparency. However, sample 2101 (Comparative Example), wherein only the calendering treatment was conducted after the development, had a surface resistance of 1.4 Ω/sq. On the other hand, it is shown that samples 2102 and 2104 (the present invention examples), which were each subjected to the calendering treatment and further immersed in the hot water, had a lower surface resistance and a higher conductivity than sample 2101. Accordingly, it is shown that the conductive film of the present invention simultaneously has a high conductivity and a high translucency.

Example 2-2

Samples prepared and subjected to exposing and developing treatments in the same way as in Example 1-1 were each subjected to a calendering treatment and a hot water immersion treatment as described below. The calendering treatment was conducted in the same way as in Example 1 except that the load was changed.

Out of the resultant samples, one subjected to no calendering treatment and immersed in the hot water for 5 minutes was named sample 2201; ones subjected to the calendering treatment with loads of 1,960 N/cm (200 kgf/cm), 2,940 N/cm (300 kgf/cm), 3,920 N/cm (400 kgf/cm), 5,880 N/cm (600 kgf/cm) and 6,860 N/cm (700 kgf/cm), respectively, and then immersed in the hot water for 5 minutes were named sample 2202 to 2206, respectively; and ones immersed in the hot water for 5 minutes and then subjected to the calendering treatment with loads of 1,960 N/cm (200 kgf/cm), 2,940 N/cm (300 kgf/cm), 3,920 N/cm (400 kgf/cm), 5,880 N/cm (600 kgf/cm) and 6,860 N/cm (700 kgf/cm), respectively, were named samples 2207 to 2211, respectively.

With respect to each of the samples, the surface resistance thereof was measured in the same way as in Example 1-1 before the hot water immersion treatment. The results are shown in Table 8 below.

(Evaluation)

The surface resistance of each of the samples 2201 to 2211 was measured in the same way as in Example 1-1. Further, the width of lines of each of the lattice patterns was measured in the same way as in Example 1-2.

The results are shown in Table 8 below.

TABLE 8

| Sample | Calendering Load (kgf/cm) | Surface resistance before hot water treatment (Ω/sq) | Period for hot water immersion | Surface resistance after hot water treatment (Ω/sq) | Line width (μm) |
|---|---|---|---|---|---|
| 2201 | 0 | 2.32 | 5 minutes | 1.378 | 17 |
| 2202 | 200 | 1.317 | 5 minutes | 0.8 | 17.2 |
| 2203 | 300 | 1.314 | 5 minutes | 0.797 | 16.8 |
| 2204 | 400 | 1.322 | 5 minutes | 0.787 | 16.9 |
| 2205 | 600 | 1.31 | 5 minutes | 0.81 | 17.4 |
| 2206 | 700 | 1.32 | 5 minutes | 0.82 | 17.2 |
| 2207 | 200 | 2.32 | 5 minutes | 1.1 | 17.2 |
| 2208 | 300 | 2.35 | 5 minutes | 1.15 | 17.4 |
| 2209 | 400 | 2.3 | 5 minutes | 1.2 | 17.6 |
| 2210 | 600 | 2.34 | 5 minutes | 1.1 | 17.8 |
| 2211 | 700 | 2.21 | 5 minutes | 1.16 | 17.2 |

As is evident from the results in Table 8, it is shown that the resistance after the entire processing of samples 2202 to 2206, which was subjected to the calendering treatment and then immersed into the hot water, was able to be made even smaller than the resistance of sample 2201, which was subjected only to the hot water immersion treatment without being subjected to any calendering treatment, and samples 2207 to 2211, which were immersed in the hot water and then subjected to the calendering treatment. For this reason, it is shown that a high conductivity can be more effectively obtained by conducting such a calendering treatment in advance and followed by conducting such a hot water immersion treatment.

Example 2-3

Samples prepared and subjected to exposing and developing treatments and calendering treatment in the same way as in Example 1-1 were each subjected to a hot water immersion treatment as described below. The hot water immersion treatment was conducted in the same way as in Example 1-1 except that the hot water temperature was changed.

Out of the resultant samples, one treated at hot water temperature of 20° C. was named sample 2301, one treated at 30° C. was named sample 2302, one treated at 40° C. was named sample 2303, one treated at 50° C. was named sample 2304, one treated at 60° C. was named sample 2305, one treated at 70° C. was named sample 2306, one treated at 80° C. was named sample 2307, one treated at 90° C. was named sample 2308, respectively.

With respect to each of the samples, the surface resistance thereof was measured in the same way as in Example 11 before and after the hot water immersion treatment. Further, the width of lines of the lattice pattern was measured in the same way as in Example 1-2. The results are shown in Table 9 below.

TABLE 9

| Sample | Temperature of hot water (° C.) | Resistance before hot water treatment (Ω/sq) | Period for hot water immersion | Resistance after hot water treatment (Ω/sq) | Line width (μm) |
|---|---|---|---|---|---|
| 2301 | 20 | 1.87 | 5 minutes | 1.87 | 19 |
| 2302 | 30 | 1.87 | 5 minutes | 1.5 | 19 |
| 2303 | 40 | 1.87 | 5 minutes | 1.3360 | 19.2 |
| 2304 | 50 | 1.87 | 5 minutes | 1.0840 | 19.4 |
| 2305 | 60 | 1.87 | 5 minutes | 0.9720 | 19.4 |
| 2306 | 70 | 1.87 | 5 minutes | 0.8100 | 19 |
| 2307 | 80 | 1.87 | 5 minutes | 0.5990 | 19.5 |
| 2308 | 90 | 1.87 | 5 minutes | 0.5680 | 19.4 |

As is evident from the results in Table 9, the resistance of the sample of the comparative example did not lower at all even when the hot water immersion treatment was conducted. The resistance of sample 2302 lowered somewhat. On the other hand, it is shown that the resistance lowered and the conductivity rose with respect to samples 2303 to 2308 of the present invention examples. In particular, as the hot water temperature was higher, the conductivity was more remarkably improved.

Example 2-4

Samples were prepared, and then subjected to exposing and developing treatments followed by a calendering treatment, and then the surface resistances of the resultants were measured after the calendering treatment in the same way as in Example 1-4. Thereafter, the samples were immersed into hot water of 90° C. In the individual hot water immersion treatment with respect to each of the samples, the period for the hot water immersion was varied in the range of 15 seconds, 30 seconds, 45 seconds, 1 minute, 2 minutes and 3 minutes, respectively.

Out of the resultant samples, samples 2401 to 2406 were samples into which a film-curing agent was not incorporated; samples 2407 to 2412 were samples wherein the ratio by mass of the binder to the film-curing agent was 22/1; samples 2413 to 2418 were samples wherein the ratio by mass of the binder to the film-curing agent was 16/1; and samples 2419 to 2424 were samples wherein the ratio by mass of the binder to the film-curing agent was 11/1.

With respect to each of the samples, the surface resistance was measured in the same way as in Example 1-1 after the hot water immersion treatment. The results are shown in Table 10.

TABLE 10

| Sample | Binder/Film-curing agent ratio | Resistance before calendering treatment (Ω/sq) | Period for hot water immersion | Resistance after hot water treatment (Ω/sq) |
|---|---|---|---|---|
| 2401 | 0 | 1.87 | 15 seconds | 1.52 |
| 2402 | 0 | 2.1 | 30 seconds | 1.32 |
| 2403 | 0 | 2.01 | 45 seconds | 1.22 |
| 2404 | 0 | 2.14 | 1 minute | 1.06 |
| 2405 | 0 | 1.89 | 2 minutes | 0.95 |
| 2406 | 0 | 1.78 | 5 minutes | 0.96 |
| 2407 | 22/1 | 6.7 | 15 seconds | 5.35 |
| 2408 | 22/1 | 5.47 | 30 seconds | 4.81 |
| 2409 | 22/1 | 7.08 | 45 seconds | 4.2 |
| 2410 | 22/1 | 7.83 | 1 minute | 3.03 |
| 2411 | 22/1 | 7.95 | 2 minutes | 3.13 |
| 2412 | 22/1 | 6.47 | 5 minutes | 3.01 |
| 2413 | 16/1 | 24.5 | 15 seconds | 20.1 |
| 2414 | 16/1 | 25.17 | 30 seconds | 19.5 |
| 2415 | 16/1 | 26.12 | 45 seconds | 16.5 |
| 2416 | 16/1 | 24.63 | 1 minute | 12.93 |
| 2417 | 16/1 | 20.32 | 2 minutes | 10.8 |
| 2418 | 16/1 | 21.81 | 5 minutes | 11.22 |
| 2419 | 11/1 | 48.55 | 15 seconds | 33.88 |
| 2420 | 11/1 | 48.92 | 30 seconds | 27.14 |
| 2421 | 11/1 | 43.97 | 45 seconds | 23.01 |
| 2422 | 11/1 | 45.75 | 1 minute | 20.78 |
| 2423 | 11/1 | 48.08 | 2 minutes | 21.71 |
| 2424 | 11/1 | 41.66 | 5 minutes | 20.49 |

As is evident from the results in Table 10, it is shown that the surface resistance is lowered and the conductivity is raised, even in samples containing a film-curing agent, as the result of conducting the hot water immersion treatment. For this reason, the following are understood: the conductivity can be improved according to the present invention; and it is preferred not to use any film-curing agent in order to make the surface resistance lower. The samples containing a film-curing agent have a larger surface resistance value than samples containing no film-curing agent. However, the value is at such a level that no practical problem is caused, It is also shown that the surface resistance reaches the lowest limit in the case that the period for hot water treatment is 1 minute or more, and the advantageous effect is not very largely improved even if the process is made longer.

Example 2-5

In the same way as in Example 1-5, the ratio by volume of Ag to the binder in the emulsion layer was set to 4.0/1, 3.1/1, 2.5/1, 2.1/1, 1.3/1, 1.1/1, and 1.0/1, respectively, and the amount of Ag therein was set to 10.5 g/m², so as to form samples 2501 to 2507, respectively, and then the resultants were each subjected to exposing and developing treatments followed by a calendering treatment. The surface resistance thereof was then measured after the calendering treatment. Thereafter, the samples were each immersed in hot water of 90° C. for 5 minutes.

With respect to each of the samples, the surface resistance thereof was measured in the same way as in Example 1-1 after the calendering treatment and after the hot water immersion treatment. The width of lines of the lattice pattern was measured in the same way as in Example 1-2. Further, the results are shown in Table 11.

TABLE 11

| Sample | Ag/Binder ratio | Resistance before calendering treatment (Ω/sq) | Period for hot water immersion | Resistance after hot water treatment (Ω/sq) | Line width (μm) |
|---|---|---|---|---|---|
| 2501 | 4 | 0.91 | 5 minutes | 0.75 | 19 |
| 2502 | 3.1 | 1.35 | 5 minutes | 0.81 | 18.2 |
| 2503 | 2.5 | 1.52 | 5 minutes | 0.92 | 18.3 |
| 2504 | 2.1 | 2.1 | 5 minutes | 1.15 | 18.5 |
| 2505 | 1.3 | 4.33 | 5 minutes | 1.63 | 18.1 |
| 2506 | 1.1 | 6.02 | 5 minutes | 2.49 | 18.2 |
| 2507 | 1 | 10.12 | 5 minutes | 4.21 | 18.6 |

As is evident from the results in Table 11, it is shown that the conductivity increases, according to the present invention, even if the photosensitive material is immersed into hot water under the condition the ratio of Ag/the binder is varied from 4/1 to 1/1.

Example 2-6

Emulsion B prepared in Example 1-4 was used to prepare an emulsion layer coating solution in the same way as in the preparation of the emulsion layer coating solution-2 in Example 1-1. To the prepared emulsion layer coating solution was added carrageenan, which was a water-soluble binder, in an amount of 0.19 g/m² with respect to Ag. The thus-prepared emulsion layer coating solution was coated onto polyethylene terephthalate (PET) supports, and then dried. The resultants were named coating sample C. The PET was subjected to hydrophilicity-imparting treatment in advance. In the resultant coating sample C, the ratio by volume of Ag to the binder in their emulsion layer was 2.3/1. The sample corresponds to the ratio of Ag to the binder is 1/1 or more, which is preferably used for photosensitive material for forming the conductive film of the present invention. In the same way as in Example 1-4, a protective layer was formed on each of their emulsion layers to form each sample. In the same way as in Example 1-1, each of the samples was subjected to exposing/developing treatments.

A calendering load of 3,920 N/cm (400 kgf/cm) was applied to each of the samples. Subsequently, the samples were immersed into hot waters of 90° C., having different pHs for 1 to 5 minutes. Out of the resultant samples, one subjected to the calendering treatment and then immersed into neutral hot water of 90° C. for 5 minutes was named sample 2601; ones subjected to the calendering treatment and then immersed into alkaline hot waters of 90° C. were named samples 2602 to 2604; and ones subjected to the calendering treatment and then immersed into acidic hot waters of 90° C. were named samples 2605 to 2607.

With respect to each of the samples, the surface resistance thereof was measured in the same way as in Example 1-1 after the calendering treatment and the hot water immersion treatment. Further, the width of lines of the lattice pattern was measured in the same way as in Example 1-2. The results are shown in Table 12,

TABLE 12

| Sample | Resistance before calendering treatment ($\Omega$/sq) | pH | Period for hot water immersion | Resistance after hot water treatment ($\Omega$/sq) | Line width ($\mu$m) |
| --- | --- | --- | --- | --- | --- |
| 2601 | 0.97 | 7 | 5 minutes | 0.57 | 20.3 |
| 2602 | 1 | 12.9 | 1 minute | 0.83 | 20.3 |
| 2603 | 1.07 | 13 | 3 minutes | 0.83 | 20.3 |
| 2604 | 0.99 | 13.2 | 5 minutes | 0.83 | 20.3 |
| 2605 | 1.04 | 2 | 1 minute | 0.5 | 20.3 |
| 2606 | 1.05 | 2.1 | 3 minutes | 0.5 | 20 |
| 2607 | 0.98 | 2 | 5 minutes | 0.4 | 20.5 |

As is evident from the results in Table 12, it is shown that even if the pH is changed to any one of acidic, neutral and alkaline values, an advantageous effect is produced for improving the conductivity. In particular, it is shown that in the case where the hot water is acidic, a larger advantageous effect is produced for improving the conductivity.

Example 2-7

An emulsion layer coating solution was prepared, using the Emulsion B prepared in Example 1-4, in the same way as in the preparation of the emulsion layer coating solution-2 in Example 1-1. To the prepared emulsion layer coating solution was added carrageenan, which was a water-soluble binder, in an amount of 0.19 g/m² with respect to Ag. The thus-prepared emulsion layer coating solution was coated onto polyethylene terephthalate (PET) supports, and then dried. The resultants were named coating sample D. The ratio by volume of Ag to the binder in each of their emulsion layers was 2.3/1, The amount of Ag was 4.0 g/m². In the same way as in Example 1-4, a protective layer was formed on each of the emulsion layers.

In the same way as in Example 1-1, each of the samples was subjected to exposing/developing treatments. Thereafter, a calendering load of 3,920 N/cm (400 kgf/cm) was applied to each of the samples. The samples were each immersed into an acidic hot water of 90° C. The used acidic solution was a 1% citric acid or 7% acetic acid solution.

Out of the resultant samples, samples 2701 to 2709 were ones immersed into the 1% citric acid solution for periods varying from 5 seconds to 5 minutes, respectively; and sample 2710 was one immersed into the 7% acetic acid solution for 5 minutes. The pH of each of the citric acid and acetic acid solutions was from 2 to 3.

TABLE 13

| Sample | Resistance after calendering treatment ($\Omega$/sq) | Period for hot water immersion | Resistance after hot water treatment ($\Omega$/sq) | Line width ($\mu$m) |
| --- | --- | --- | --- | --- |
| 2701 | 5.08 | 5 seconds | 3.1 | 18.5 |
| 2702 | 5.76 | 10 seconds | 3.29 | 18.3 |
| 2703 | 4.97 | 15 seconds | 2.7 | 18.4 |
| 2704 | 4.87 | 20 seconds | 2.92 | 18.6 |
| 2705 | 4.68 | 25 seconds | 2.82 | 18.5 |
| 2706 | 4.83 | 30 seconds | 2.76 | 18.7 |
| 2707 | 4.93 | 60 seconds | 2.79 | 18.5 |
| 2708 | 4.92 | 5 minutes | 2.53 | 18.4 |
| 2709 | 5.06 | 30 minutes | 2.64 | 18.6 |
| 2710 | 5.01 | 15 seconds | 2.65 | 18.3 |

As is evident from the results in Table 13, it is shown that: in any one of these cases, an advantageous effect was produced for improving the conductivity; in the cases where the immersing period was from 5 to 10 seconds, the advantageous effect was smaller than in the cases where the period was 15 seconds or more; and thus the conductivity was further improved, in particular, in the cases where the immersion was continued for 15 seconds or more. It is also shown that even when the used acids were different from each other in kind, the conductivity was improved similarly by the hot water immersion treatment.

Example 2-8

Samples 2801 to 2804 were prepared in the same way as in Example 1-6. Samples 2801 and 2802 were ones dried under the curing condition of 120° C. for 30 minutes. Samples 2803 and 2804 were ones allowed to stand still for 10 minutes and then naturally dried. Thereafter, samples 2802 and 2804 were subjected to a calendering treatment in the same way as in Example 1-6. Samples 2801 and 2803 were subjected to no calendering treatment.

Next, each of the samples was brought into contact with vapor of 90° C. for 10 minutes.

With respect to each of the samples, the surface resistance thereof was measured in the same way as in Example 1-1 after the drying, after the calendering treatment and after the vapor contacting treatment. The results are shown in Table 14.

TABLE 14

| Sample | Drying | Resistance after Coating ($\Omega$/sq) | Resistance before calendering treatment ($\Omega$/sq) | Period for hot water immersion | Resistance after hot water treatment ($\Omega$/sq) |
| --- | --- | --- | --- | --- | --- |
| 2801 | 120° C. 30 minutes | 0.02 | — | 10 minutes | 0.014 |
| 2802 | 120° C. 30 minutes | 0.02 | 0.022 | 10 minutes | 0.01 |
| 2803 | naturally | 0.2672 | — | 10 minutes | 0.027 |
| 2804 | naturally | 0.281 | 0.301 | 10 minutes | 0.02 |

As is evident from the results in Table 14, in the case of using the silver nano-paste, a conductive film can be formed in a short time by conducting drying process instead of exposing and developing treatments for silver salt photosensitive material. The resistance of samples 2801 and 2802, which were dried at 120° C., was able to be more effectively lowered than the resistance of samples 2803 and 2804, which were naturally dried. Furthermore, the resistance of samples 2802 and 2804, wherein the calendering treatment was conducted, was able to be more effectively lowered than the resistance of samples 2801 and 2803, wherein no calendering treatment was conducted.

Example 3-1

Samples were prepared, and then subjected to exposing and developing treatments followed by a calendering treatment, and then the surface resistances of the resultants were measured after the calendering treatment in the same way as in Example 1-1. Thereafter, each of the samples was subjected to a hygrothermal treatment for 1 hour, Out of the resultant samples, one treated under a humidity-adjusted condition that the temperature was 40° C. and the relative humidity was 5% was named sample 3101; one treated under a humidity-adjusted condition that the temperature was 60° C. and the relative humidity was 5% was named sample 3102; one treated under a humidity-adjusted condition that the temperature was 80° C. and the relative humidity was 5% was named sample 3103; and one treated under a humidity-adjusted condition that the temperature was 100° C. and the relative humidity was 5% was named sample 3104.
(Evaluation)
The surface resistance of each of the samples was measured in the same way as in Example 1-1. The results are shown in Table 15 below.

TABLE 15

| Sample | Temperature of Hygrothermal treatment | Resistance before Hygrothermal treatment (Ω/sq) | Resistance after Hygrothermal treatment (Ω/sq) |
| --- | --- | --- | --- |
| 3101 | 40° C. | 8 | 7.6 |
| 3102 | 60° C. | 8.1 | 7.533 |
| 3103 | 80° C. | 8 | 7.192 |
| 3104 | 100° C. | 8.2 | 6.478 |

As is evident from the results in Table 15, it is shown that the surface resistance was lowered and the conductivity was improved, in any one of the samples subjected to the hygrothermal treatment. In particular, it is shown that a more effective result is obtained and the resistance becomes lower as the temperature for the process rises.

Example 3-2

Samples prepared and then subjected to exposing and developing treatments in the same way as in Example 1-1 were each subjected to a calendering treatment and a hygrothermal treatment as described below, The calendering treatment was conducted with a calendering load of 3,920 N/cm (400 kgf/cm). The hygrothermal treatment was conducted in the same way as in Example 31 except that the humidity-adjusted condition was varied.

Out of the resultant samples, samples 3201 to 3206 were samples treated under the following humidity-adjusted conditions for 30 minutes: humidity-adjusted conditions that the temperature was 100° C. and the relative humidity was 5%; the temperature was 100° C. and the relative humidity was 20%; the temperature was 100° C. and the relative humidity was 40%; the temperature was 100° C. and the relative humidity was 50%; the temperature was 100° C. and the relative humidity was 60%; and the temperature was 100° C. and the relative humidity was 80%, respectively; and sample 3207 was a sample treated under a humidity-adjusted condition that the temperature was 100° C. and the relative humidity was 80% for 30 minutes without being subjected to any calendering treatment.

With respect to each of the samples, the surface resistance was measured in the same way as in Example 1-1 before and after the hygrothermal treatment, The results are shown in Table 16 below.

TABLE 16

| Sample | Humidity of Hygrothermal treatment | Resistance before Hygrothermal treatment (Ω/sq) | Resistance after Hygrothermal treatment (Ω/sq) |
| --- | --- | --- | --- |
| 3201 | 5% | 8 | 6.48 |
| 3202 | 20% | 8.1 | 6.4 |
| 3203 | 40% | 8 | 5.8 |
| 3204 | 50% | 8.2 | 5.2 |
| 3205 | 60% | 8 | 4.5 |
| 3206 | 80% | 8 | 3.8 |
| 3207 | 80% | 8.1 | 7 |

As is evident from the results in Table 16, it is shown that the surface resistance was lowered and the conductivity was improved in any one of the samples subjected to the hygrothermal treatment. In particular, it is shown that a more effective result is obtained as the humidity is higher, and a still more effective result is obtained when the humidity is 80%. It is also shown from the results of samples 3206 and 3207 that a still more effective result is obtained when such a calendering treatment and subsequently such a hygrothermal treatment is conducted.

Example 3-3

Coating samples were prepared in the same way as in Example 1-1. At this time, the amount of gelatin in the emulsion layer coating solution was changed to vary the ratio by volume of Ag to the binder in the emulsion layer to 4.0/1, 2.3/1, and 1.0/1, respectively. Moreover, the blended amount of the film-curing agent (Cpd-7) in the coating sample B was changed to vary the ratio by mass of the film-curing agent to the binder as shown in Table 17 below. In the same way as in Example 1-3, a protective layer was formed on each of their emulsion layers. In this way, samples 3301 to 3318 were prepared wherein the amount of Ag was 10.5 g/m$^2$.

The individual samples were subjected to exposing and developing treatments in the same way as in Example 1-1. Thereafter, the samples were subjected to a hygrothermal treatment under a humidity-adjusted condition that the temperature was 100° C. and the relative humidity was 80% while a calendering load of 3,920 N/cm (400 kgf/cm) was applied thereto. The period for the process was varied to 10, 30 or 60 minutes.

With respect to each of the samples, the surface resistance was measured in the same way as in Example 1-1 before and after the hygrothermal treatment. The results are shown in Table 17 below.

TABLE 17

| Sample | Ag/Binder ratio | Film-Curing agent/binder Ratio | Period for Hygrothermal treatment | Resistance before Hygrothermal treatment (Ω/sq) | Resistance after Hygrothermal treatment (Ω/sq) |
| --- | --- | --- | --- | --- | --- |
| 3301 | 4.0/1.0 | 0% | 10 minutes | 2 | 0.85 |
| 3302 | 4.0/1.0 | 0% | 30 minutes | 2.1 | 0.82 |

TABLE 17-continued

| Sample | Ag/Binder ratio | Film-Curing agent/binder Ratio | Period for Hygrothermal treatment | Resistance before Hygrothermal treatment (Ω/sq) | Resistance after Hygrothermal treatment (Ω/sq) |
|---|---|---|---|---|---|
| 3303 | 4.0/1.0 | 0% | 60 minutes | 2 | 0.82 |
| 3304 | 4.0/1.0 | 1% | 10 minutes | 4 | 0.98 |
| 3305 | 4.0/1.0 | 1% | 30 minutes | 4 | 1 |
| 3306 | 4.0/1.0 | 1% | 60 minutes | 4.1 | 0.99 |
| 3307 | 2.3/1.0 | 0% | 10 minutes | 3 | 0.9 |
| 3308 | 2.3/1.0 | 0% | 30 minutes | 3 | 0.92 |
| 3309 | 2.3/1.0 | 0% | 60 minutes | 3 | 0.9 |
| 3310 | 2.3/1.0 | 1% | 10 minutes | 7 | 1.5 |
| 3311 | 2.3/1.0 | 1% | 30 minutes | 7.2 | 1.4 |
| 3312 | 2.3/1.0 | 1% | 60 minutes | 7.1 | 1.5 |
| 3313 | 1.0/1.0 | 0% | 10 minutes | 8 | 4 |
| 3314 | 1.0/1.0 | 0% | 30 minutes | 8 | 3.9 |
| 3315 | 1.0/1.0 | 0% | 60 minutes | 8.1 | 3.7 |
| 3316 | 1.0/1.0 | 1% | 10 minutes | 15 | 7.8 |
| 3317 | 1.0/1.0 | 1% | 30 minutes | 15.2 | 7.5 |
| 3318 | 1.0/1.0 | 1% | 60 minutes | 15 | 7.2 |

As is evident from the results in Table 17, it is shown that the conductivity is improved, according to the present invention, even if hygrothermal treatment is conducted under the condition the ratio of Ag to the binder is varied from 4.0/1 to 1.0/1. It is also shown that the conductivity is improved by hygrothermal treatment whether or not a film-curing agent is used.

Example 3-4

Samples 3401 to 3404 were prepared in the same way as in Example 1-6. Samples 3401 and 3402 were dried under the curing condition of 120° C. for 30 minutes. Samples 3403 and 3404 were allowed to stand still for 10 minutes and then naturally dried. Thereafter, samples 3402 and 3404 were subjected to a calendering treatment in the same way as in Example 1-6. Samples 3401 and 3403 were not subjected to any calendering treatment.

Next, each of the samples was allowed to stand still under a humidity-adjusted condition that the temperature was 100° C. and the humidity was 80%.

With respect to each of the samples, the surface resistance was measured in the same way as in Example 1-1 after the drying, after the calendering treatment and after the hygrothermal treatment. The results are shown in Table 18.

TABLE 18

| Sample | Drying | Resistance after coating (Ω/sq) | Resistance after calendering treatment (Ω/sq) | Period for Hygrothermal treatment | Resistance after Hygrothermal treatment (Ω/sq) |
|---|---|---|---|---|---|
| 3401 | 120° C. 30 minutes | 0.02 | — | 10 minutes | 0.014 |
| 3402 | 120° C. 30 minutes | 0.02 | 0.022 | 10 minutes | 0.01 |
| 3403 | naturally | 0.2672 | — | 10 minutes | 0.027 |
| 3404 | naturally | 0.281 | 0.301 | 10 minutes | 0.02 |

As is evident from the results in Table 18, in the case of using the silver nano-paste, a conductive film can be formed in a short time by conducting drying process instead of exposing and developing treatments for silver salt photosensitive material. The resistance in samples 3401 and 3402, which were dried at 120° C., was able to be more effectively lowered than the resistance in samples 3403 and 3404, which were naturally dried. Furthermore, the resistance in samples 3402 and 3404, wherein the calendering treatment was conducted, was able to be more effectively lowered than the resistance of samples 3401 and 3403, wherein no calendering treatment was conducted.

INDUSTRIAL APPLICABILITY

According to the method of the present invention, a conductive film having a high conductivity can be produced at low cost without conducting any plating treatment. Moreover, when its conductive metal portion is a predetermined patterned form, the conductive film has a high transparency besides the high conductivity. In particular, a translucent conductive film having a high electromagnetic wave shielding property and a high transparency, and including black meshes (a black mesh portion) can be produced at low cost by use of a silver salt photosensitive material.

Further, the conductive film produced by the method of the present invention is low in resistance, and can be used as an electromagnetic wave shielding material. In particular, the conductive film which has translucency is useful as a translucent electromagnetic wave shielding film, a transparent heat-generating film or the like. The conductive film of the present invention may be applied to a liquid crystal television, a plasma television, an organic EL, an inorganic FL, a solar cell, a touch panel, and others. Additionally, the conductive film may widely be applied, as a conductive patterning material, to a printed circuit board or others.

Having described our invention as related to the present embodiments, it is our intention that the present invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2006-345000 filed in Japan on Dec. 21, 2006, and Patent Application No. 2007-93021 filed in Japan on Mar. 30, 2007, each of which is entirely herein incorporated by reference.

The invention claimed is:

1. A method for producing a conductive film, comprising the steps of:
   forming, on a support, a conductive metal portion containing a conductive material and a binder; and
   bringing the conductive metal portion into contact with vapor.

2. The method for producing a conductive film according to claim 1, wherein the temperature of the vapor is 80° C. or higher.

3. The method for producing a conductive film according to claim 1, wherein the vapor is water vapor.

4. The method for producing a conductive film according to claim 1, comprising a step of subjecting the conductive metal portion to smoothing treatment before the step of contacting with vapor.

5. The method for producing a conductive film according to claim 4, wherein the smoothing treatment is conducted at a linear pressure of 1,960 N/cm (200 kgf/cm) or more.

6. The method for producing a conductive film according to claim 4, wherein the smoothing treatment is conducted at a linear pressure of 2,940 N/cm (300 kgf/cm) or more.

7. The method for producing a conductive film according to claim 4, wherein the smoothing treatment is conducted at a linear pressure of 6,860 N/cm (700 kgf/cm) or less.

8. The method for producing a conductive film according to claim 1, including a washing step of washing the conductive metal portion with water after the vapor contacting step.

9. A method for producing a conductive film, comprising the steps of:
   exposing a photosensitive material having a photosensitive layer containing a photosensitive silver salt and a water-soluble binder on a support to light, and then developing the resultant, thereby forming a conductive metal silver portion on the support; and
   bringing the conductive metal silver portion into contact with vapor.

10. The method for producing a conductive film according to claim 1, wherein the bringing the conductive metal portion into contact with the vapor improves a conductivity of the conductive film.

11. The method for producing a conductive film according to claim 1, wherein the binder is a water-soluble polymer.

12. The method for producing a conductive film according to claim 11, wherein the water-soluble polymer is a gelatin.

13. The method for producing a conductive film according to claim 4, wherein the binder is a water soluble polymer that is gelatin.

14. The method for producing a conductive film according to claim 9, wherein the bringing the conductive metal portion into contact with the vapor improves a conductivity of the conductive film.

15. The method for producing a conductive film according to claim 9, wherein the binder is a water-soluble polymer.

16. The method for producing a conductive film according to claim 15, wherein the water-soluble polymer is a gelatin.

* * * * *